United States Patent
Lee

(10) Patent No.: US 10,886,261 B1
(45) Date of Patent: Jan. 5, 2021

(54) LIGHT EMITTING DIODE (LED) DISPLAY AND METHOD FOR MANUFACTURING THE SAME

(71) Applicant: a.u. Vista, Inc., Irvine, CA (US)

(72) Inventor: Seok-Lyul Lee, Hsinchu (TW)

(73) Assignee: A.U. VISTA, INC., Irvine, CA (US)

( * ) Notice: Subject to any disclaimer, the term of this patent is extended or adjusted under 35 U.S.C. 154(b) by 0 days.

(21) Appl. No.: 16/891,740

(22) Filed: Jun. 3, 2020

(51) Int. Cl.
| G02F 1/13357 | (2006.01) |
| G02F 1/1335 | (2006.01) |
| H01L 25/075 | (2006.01) |
| G02B 26/02 | (2006.01) |
| H01L 25/16 | (2006.01) |

(52) U.S. Cl.
CPC .......... *H01L 25/0753* (2013.01); *G02B 26/02* (2013.01); *G02F 1/133514* (2013.01); *G02F 1/133603* (2013.01); *G02F 1/133617* (2013.01); *H01L 25/167* (2013.01); *G02F 2201/44* (2013.01)

(58) Field of Classification Search
None
See application file for complete search history.

(56) References Cited

U.S. PATENT DOCUMENTS

2016/0035314 A1  2/2016  Pan

FOREIGN PATENT DOCUMENTS

| CN | 102023380 B | 8/2015 |
| TW | 202020829 A | 6/2020 |

*Primary Examiner* — Phu Vu
(74) *Attorney, Agent, or Firm* — Tim Tingkang Xia, Esq.; Locke Lord LLP

(57) ABSTRACT

A light emitting diode (LED) display panel includes a LED array, a color change layer, and a shutter layer disposed therebetween. The LED array is formed by multiple LEDs, defining multiple pixels. Each pixel has a corresponding LED and multiple sub-pixels. The color change layer includes multiple color change structures corresponding to the sub-pixels. The shutter layer defines multiple shutter structures correspondingly aligned to the sub-pixels and the color change structures. Each shutter structure is independently controlled to be switchable between a first state, where light emitted by the corresponding LED is prevented from reaching the corresponding color change structure, and a second state, where light emitted by the corresponding LED is allowed to reach the corresponding color change structure. For each pixel, only the shutter structure corresponding to one sub-pixel is in the second state, and the shutter structures corresponding to the other sub-pixels are in the first state.

20 Claims, 30 Drawing Sheets

100

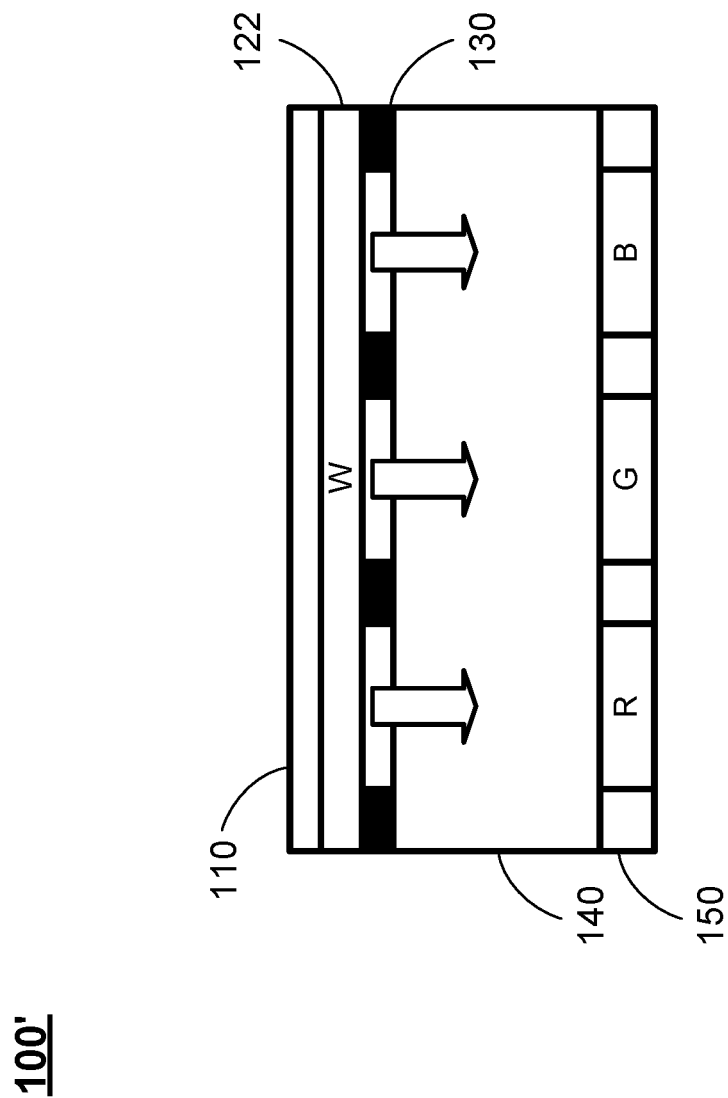

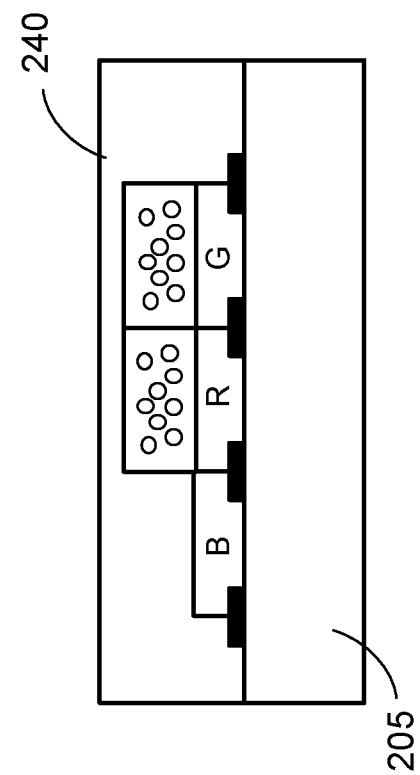
FIG. 4D
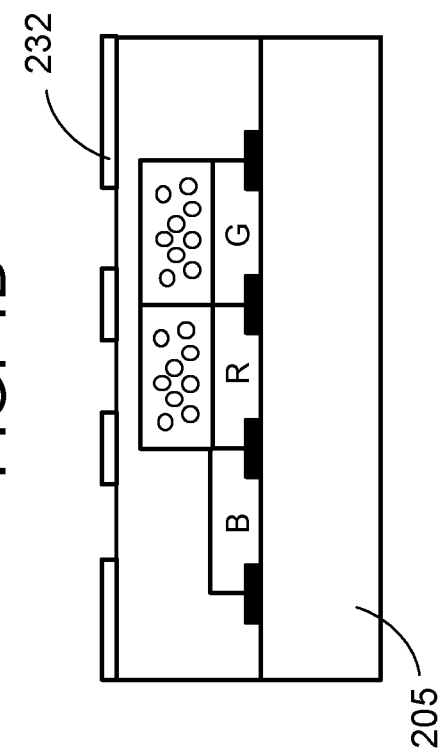
FIG. 4E
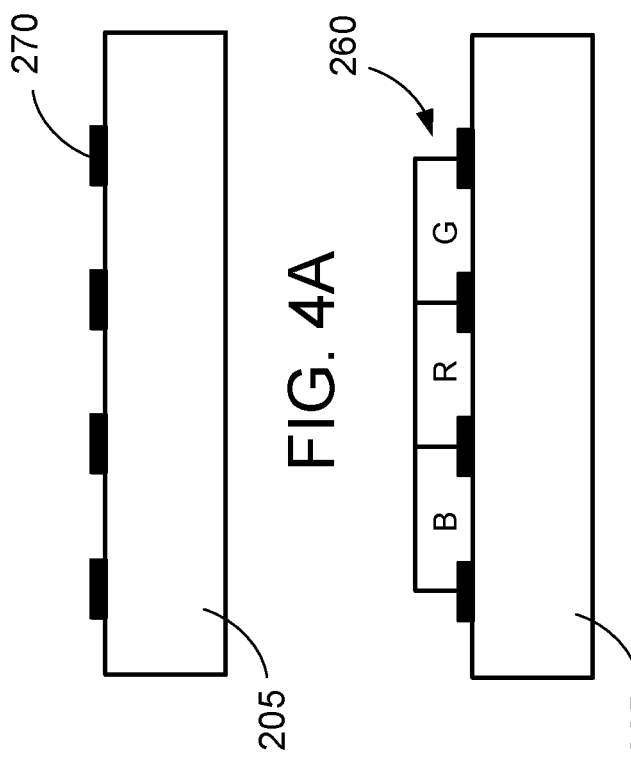
FIG. 4A
FIG. 4B
FIG. 4C
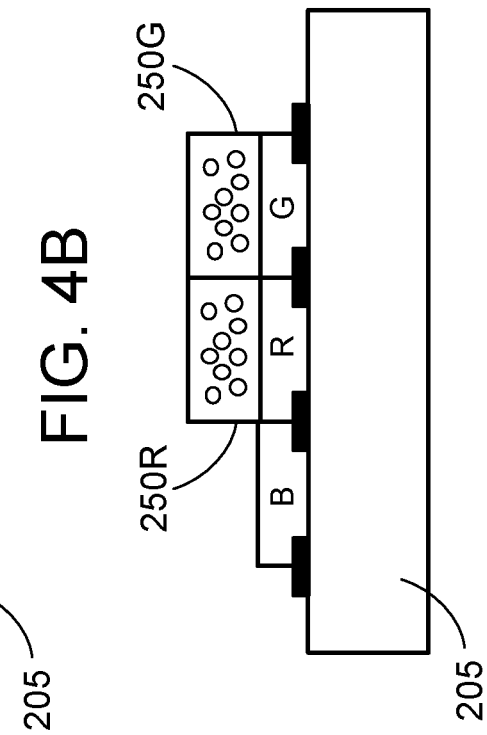

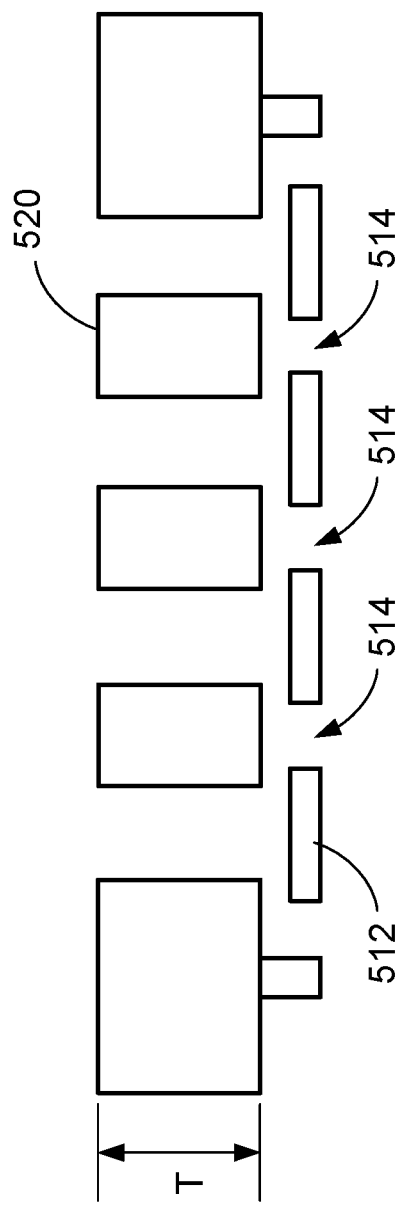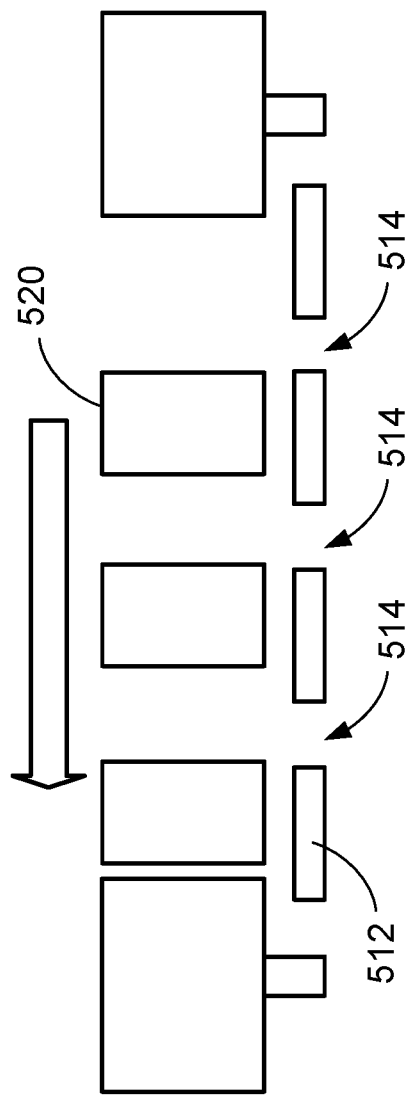

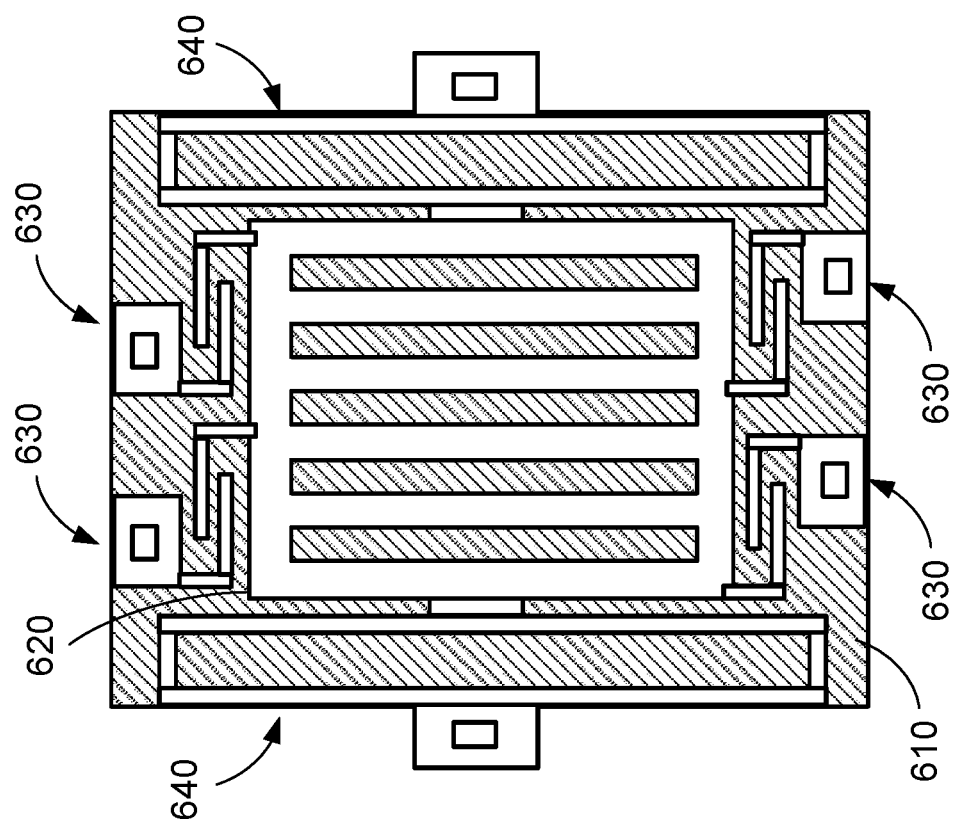

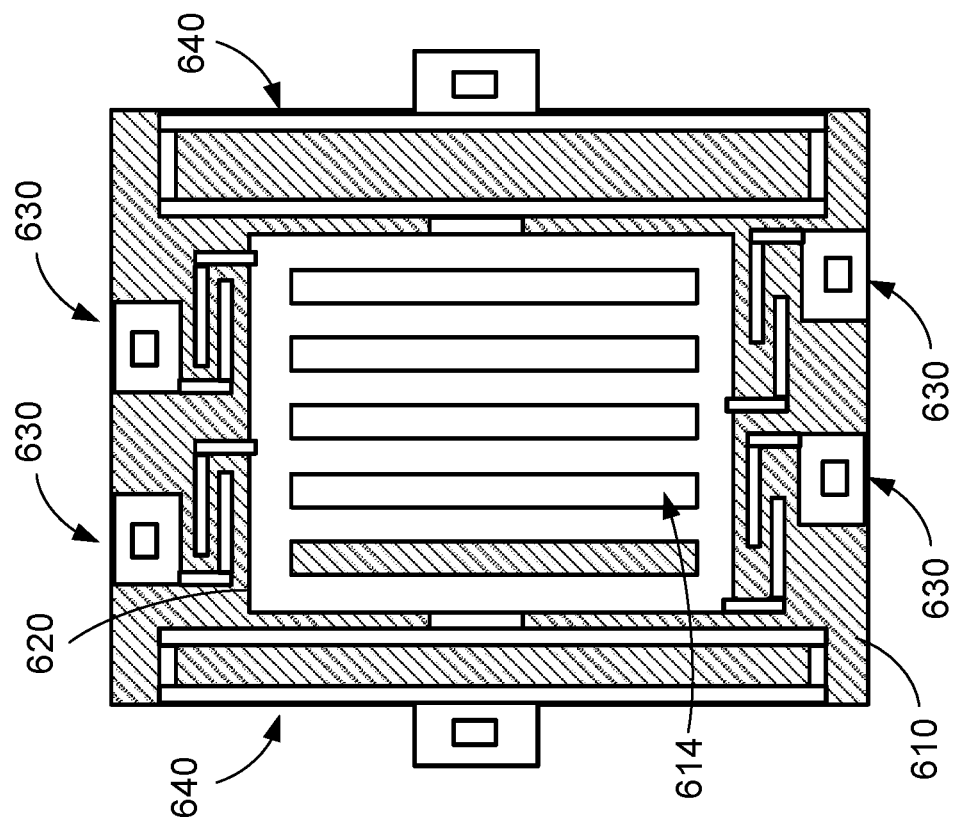

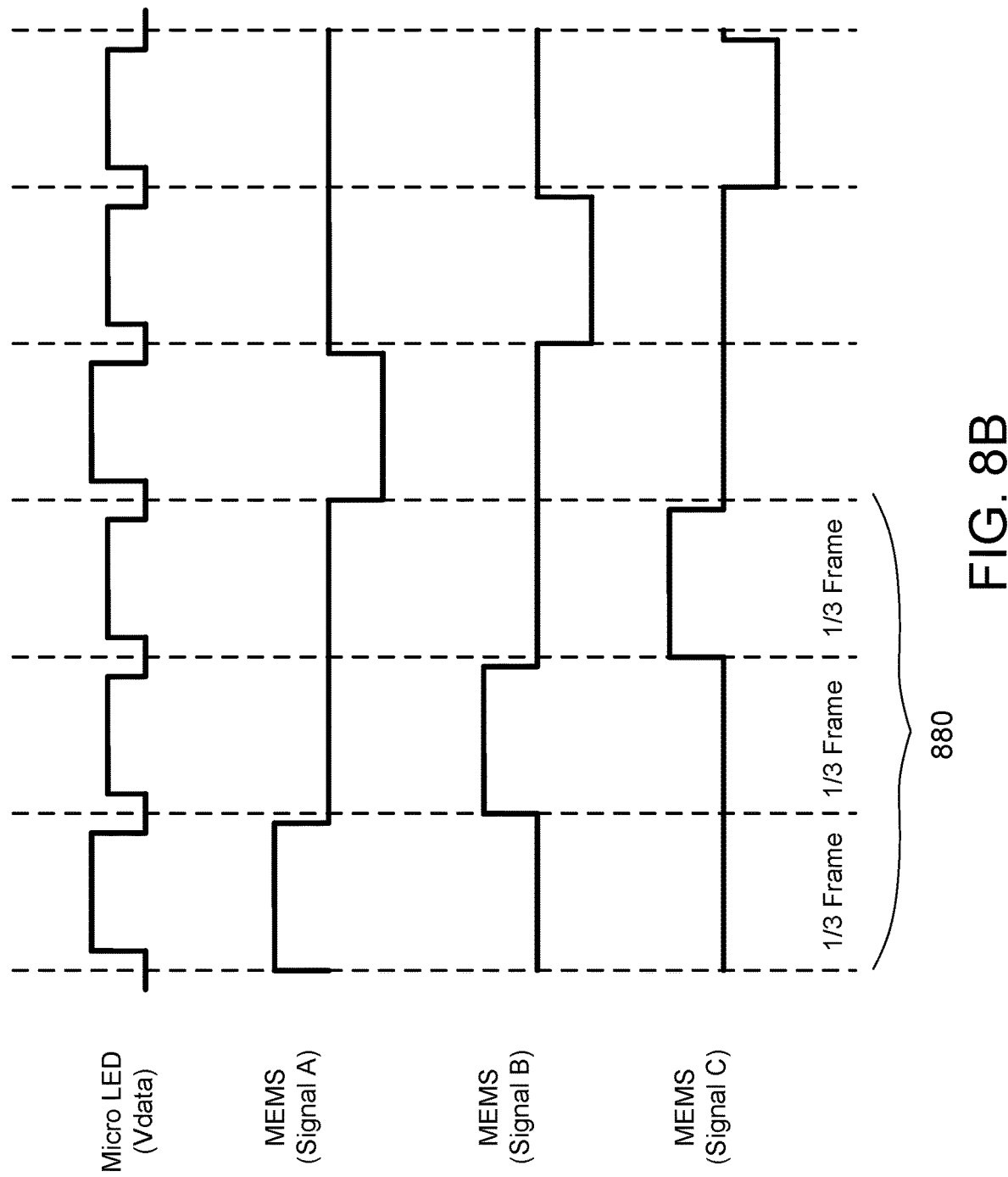

LIGHT EMITTING DIODE (LED) DISPLAY AND METHOD FOR MANUFACTURING THE SAME

FIELD

The disclosure relates generally to display technology, and more particularly to a light emitting diode (LED) display and method for manufacturing the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A light emitting diode (LED) display is a self-emitting display that uses individual LED chips as the emitters. For example, a micro-LED display, which is a LED display using the LED chips with their sizes being less than 100 um (micro-meter), is a potentially disruptive display technology because of its outstanding features such as low power consumption, good sunlight readability, true black state, high dynamic range and wide color gamut. However, it is still challenging for the mass transfer of micro-LEDs from semiconductor wafer to glass substrate with high yield.

Therefore, a heretofore unaddressed need exists in the art to address the aforementioned deficiencies and inadequacies.

SUMMARY

One aspect of the disclosure relates to a light emitting diode (LED) display panel, which includes: a LED array formed by a plurality of LEDs, and defining a plurality of pixels, wherein each of the pixels has a corresponding one of the LEDs and a plurality of sub-pixels, and the sub-pixels of each of the pixels comprise a first color sub-pixel, a second color sub-pixel and a third color sub-pixel; a color change layer, comprising a plurality of color change structures corresponding to the sub-pixels; and a shutter layer disposed between the LED array and the color change layer, defining a plurality of shutter structures correspondingly aligned to the sub-pixels and the color change structures, wherein each of the shutter structures is independently controlled to be switchable between a first state and a second state. For a respective shutter structure corresponding to each of the sub-pixels, when the respective shutter structure is in the first state, light emitted by the corresponding one of the LEDs is reflected or blocked by the respective shutter structure in the first state from reaching a corresponding one of the color change structures, and when the respective shutter structure is in the second state, the light emitted by the corresponding one of the LEDs is allowed to pass through the respective shutter structure in the second state to reach the corresponding one of the color change structures. For each of the pixels, only the shutter structure corresponding to one of the first color, second color and third color sub-pixels is in the second state, and the shutter structures corresponding to the other two of the first color, second color and third color sub-pixels are in the first state.

In certain embodiments, for each of the pixels, in a first one-third frame, the shutter structure corresponding to the first color sub-pixel is in the second state, and the shutter structure corresponding to the second color sub-pixel and the shutter structure corresponding to the third color sub-pixel are in the first state; in a second one-third frame, the shutter structure corresponding to the second color sub-pixel is in the second state, and the shutter structure corresponding to the third color sub-pixel and the shutter structure corresponding to the first color sub-pixel are in the first state; and in a third one-third frame, the shutter structure corresponding to the third color sub-pixel is in the second state, and the shutter structure corresponding to the first color sub-pixel and the shutter structure corresponding to the second color sub-pixel are in the first state.

In certain embodiments, each of the shutter structures is a micro-electromechanical system (MEMS) shutter structure comprising: a shielding layer having a plurality of openings aligned to the corresponding one of the sub-pixels to expose a corresponding one of the color change structures; and a micro-shutter corresponding to the openings, wherein the micro-shutter is movable between a first position and a second position relative to the shielding layer; wherein when the respective shutter structure is in the first state, the micro-shutter of the respective shutter structure moves to the first position to block the openings; and wherein when the respective shutter structure is in the second state, the micro-shutter of the respective shutter structure moves to the second position to allow the light emitted by the corresponding one of the LEDs to pass the openings to reach the corresponding one of the color change structures.

In certain embodiments, the micro-shutter of each of the shutter structures comprises: a shutter movable between the first position and the second position; at least one electrostatic actuator configured to drive the shutter to move between the first position and the second position; and a spring structure supporting the shutter to move between the first position and the second position.

In certain embodiments, when the at least one electrostatic actuator is provided with an actuating voltage, the at least one electrostatic actuator drives the shutter to move from the first position to the second position, and the spring structure is deformed to generate an elastic force against the shutter; and when the at least one electrostatic actuator is not provided with the actuating voltage, the elastic force generated by the spring structure drives the shutter to move from the second position back to the first position.

In certain embodiments, a thickness of the shutter is between 0.1 um and 20 um, a width of each of the openings is between 5 um and 50 um, and a distance between the first position and the second position is between 5 um and 50 um.

In certain embodiments, the shutter layer is formed by a cholesteric liquid crystal (CLC) layer, and for each of the sub-pixels, the CLC layer is configured to switch between a reflective state as the first state and a transparent state as the second state.

In certain embodiments, the pixels comprises a plurality of pixel groups, each of the pixel groups comprises a first pixel, a second pixel and a third pixel, and for each of the pixel groups, in a first one-third frame, the shutter structure corresponding to the first color sub-pixel of the first pixel is in the second state, the shutter structure corresponding to the second color sub-pixel of the second pixel is in the second state, the shutter structure corresponding to the third color sub-pixel of the third pixel is in the second state, and the shutter structures corresponding to other sub-pixels of the first, second and third pixels are in the first state; in a second one-third frame, the shutter structure corresponding to the second color sub-pixel of the first pixel is in the second state, the shutter structure corresponding to the third color sub-pixel of the second pixel is in the second state, the shutter structure corresponding to the first color sub-pixel of the third pixel is in the second state, and the shutter structures corresponding to other sub-pixels of the first, second and third pixels are in the first state; and in a third one-third frame, the shutter structure corresponding to the third color sub-pixel of the first pixel is in the second state, the shutter structure corresponding to the first color sub-pixel of the second pixel is in the second state, the shutter structure corresponding to the second color sub-pixel of the third pixel is in the second state, and the shutter structures corresponding to other sub-pixels of the first, second and third pixels are in the first state.

In certain embodiments, each of the LEDs is a blue LED, each of the color change structures corresponding to the first color sub-pixel comprises a first color converter configured to convert blue light emitted by the blue LED to a first color light, and each of the color change structures corresponding to the second color sub-pixel comprises a second color converter configured to convert blue light emitted by the blue LED to a second color light.

In certain embodiments, each of the first color converter and the second color converter is a quantum material structure or a phosphor structure.

In certain embodiments, each of the color change structures further comprises a color filter.

In another aspect, a display panel includes: a light-emitting layer formed on a substrate, and defining a plurality of pixels, wherein each of the pixels has a plurality of sub-pixels, and the sub-pixels of each of the pixels comprise a first color sub-pixel, a second color sub-pixel and a third color sub-pixel; wherein the pixels comprises a plurality of pixel groups, each of the pixel groups comprises a first pixel, a second pixel and a third pixel, and for each of the pixel groups, in a first one-third frame, light emitted by the corresponding one of the first pixel is allowed to pass through the first color sub-pixel of the first pixel and is reflective or blocked from reaching the second and third color sub-pixels of the first pixel, light emitted by the corresponding one of the second pixel is allowed to pass through the second color sub-pixel of the second pixel and is reflective or blocked from reaching the first and third color sub-pixels of the second pixel, and light emitted by the corresponding one of the third pixel is allowed to pass through the third color sub-pixel of the third pixel and is reflective or blocked from reaching the first and second color sub-pixels of the third pixel; in a second one-third frame, the light emitted by the corresponding one of the first pixel is allowed to pass through the second color sub-pixel of the first pixel and is reflective or blocked from reaching the first and third color sub-pixels of the first pixel, the light emitted by the corresponding one of the second pixel is allowed to pass through the third color sub-pixel of the second pixel and is reflective or blocked from reaching the first and second color sub-pixels of the second pixel, and the light emitted by the corresponding one of the third pixel is allowed to pass through the first color sub-pixel of the third pixel and is reflective or blocked from reaching the second and third color sub-pixels of the third pixel; and in a third one-third frame, the light emitted by the corresponding one of the first pixel is allowed to pass through the third color sub-pixel of the first pixel and is reflective or blocked from reaching the first and second color sub-pixels of the first pixel, the light emitted by the corresponding one of the second pixel is allowed to pass through the first color sub-pixel of the second pixel and is reflective or blocked from reaching the second and third color sub-pixels of the second pixel, and the light emitted by the corresponding one of the third pixel is allowed to pass through the second color sub-pixel of the third pixel and is reflective or blocked from reaching the first and third color sub-pixels of the third pixel.

In certain embodiments, the display panel further includes: a color change layer, comprising a plurality of color change structures corresponding to the sub-pixels; and a shutter layer disposed between the light emitting layer and the color change layer, defining a plurality of shutter structures correspondingly aligned to the sub-pixels and the color change structures, wherein each of the shutter structures is independently controlled to be switchable between a first state and a second state, wherein the light emitting layer is a light emitting diode (LED) array formed by a plurality of LEDs, and each of the pixels has a corresponding one of the LEDs; wherein for a respective shutter structure corresponding to each of the sub-pixels, when the respective shutter structure is in the first state, light emitted by the corresponding one of the LEDs is reflected or blocked by the respective shutter structure in the first state from reaching a corresponding one of the color change structures, and when the respective shutter structure is in the second state, the light emitted by the corresponding one of the LEDs is allowed to pass through the respective shutter structure in the second state to reach the corresponding one of the color change structures; and wherein for each of the pixel groups, in the first one-third frame, the shutter structure corresponding to the first color sub-pixel of the first pixel is in the second state, the shutter structure corresponding to the second color sub-pixel of the second pixel is in the second state, the shutter structure corresponding to the third color sub-pixel of the third pixel is in the second state, and the shutter structures corresponding to other sub-pixels of the first, second and third pixels are in the first state; in the second one-third frame, the shutter structure corresponding to the second color sub-pixel of the first pixel is in the second state, the shutter structure corresponding to the third color sub-pixel of the second pixel is in the second state, the shutter structure corresponding to the first color sub-pixel of the third pixel is in the second state, and the shutter structures corresponding to other sub-pixels of the first, second and third pixels are in the first state; and in the third one-third frame, the shutter structure corresponding to the third color sub-pixel of the first pixel is in the second state, the shutter structure corresponding to the first color sub-pixel of the second pixel is in the second state, the shutter structure corresponding to the second color sub-pixel of the third pixel is in the second state, and the shutter structures corresponding to other sub-pixels of the first, second and third pixels are in the first state.

In certain embodiments, each of the shutter structures is a micro-electromechanical system (MEMS) shutter structure comprising: a shielding layer having a plurality of openings aligned to the corresponding one of the sub-pixels to expose a corresponding one of the color change structures; and a micro-shutter corresponding to the openings, wherein the micro-shutter is movable between a first position and a second position relative to the shielding layer; wherein when the respective shutter structure is in the first state, the micro-shutter of the respective shutter structure moves to the first position to block the openings; and wherein when the respective shutter structure is in the second state, the micro-shutter of the respective shutter structure moves to the second position to allow the light emitted by the corresponding one of the LEDs to pass the openings to reach the corresponding one of the color change structures.

In certain embodiments, the micro-shutter of each of the shutter structures comprises: a shutter movable between the first position and the second position; at least one electrostatic actuator configured to drive the shutter to move between the first position and the second position; and a spring structure supporting the shutter to move between the first position and the second position.

In certain embodiments, when the at least one electrostatic actuator is provided with an actuating voltage, the at least one electrostatic actuator drives the shutter to move from the first position to the second position, and the spring structure is deformed to generate an elastic force against the shutter; and when the at least one electrostatic actuator is not provided with the actuating voltage, the elastic force generated by the spring structure drives the shutter to move from the second position back to the first position.

In certain embodiments, a thickness of the shutter is between 0.1 um and 20 um, a width of each of the openings is between 5 um and 50 um, and a distance between the first position and the second position is between 5 um and 50 um.

In certain embodiments, the shutter layer is formed by a cholesteric liquid crystal (CLC) layer, and for each of the sub-pixels, the CLC layer is configured to switch between a reflective state as the first state and a transparent state as the second state.

In certain embodiments, each of the LEDs is a blue LED, each of the color change structures corresponding to the first color sub-pixel comprises a first color converter configured to convert blue light emitted by the blue LED to a first color light, and each of the color change structures corresponding to the second color sub-pixel comprises a second color converter configured to convert blue light emitted by the blue LED to a second color light.

In certain embodiments, each of the first color converter and the second color converter is a quantum material structure or a phosphor structure.

In certain embodiments, each of the color change structures further comprises a color filter.

In yet another aspect, the disclosure relates to a display device, which includes the LED display panel as described above.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 1B schematically shows a pixel of a LED display panel using white micro-LEDs and color filters according to certain embodiments of the present disclosure.

FIGS. 4A-4J schematically show a manufacturing process of the LED display panel as shown in FIG. 2 according to certain embodiments of the present disclosure.

FIG. 5F schematically shows a cross-sectional view of the shutter and the shielding layer of the MEMS shutter structure as shown in FIG. 5A, where the shutter is located at the first position.

FIG. 5G schematically shows a cross-sectional view of the shutter and the shielding layer of the MEMS shutter structure as shown in FIG. 5A, where the shutter is located at the second position.

FIG. 6A schematically shows a top view of a MEMS shutter structure according to certain embodiments of the present disclosure, where the shutter is located at the first position.

FIG. 6C schematically shows a top view of the MEMS shutter structure as shown in FIG. 6A, where the shutter is located at the second position.

FIG. 8B shows the data voltage and the actuating voltage signals for the shutters of the pixel of the LED display panel as shown in FIG. 7A.

DETAILED DESCRIPTION OF THE DISCLOSURE

Figure 1A:
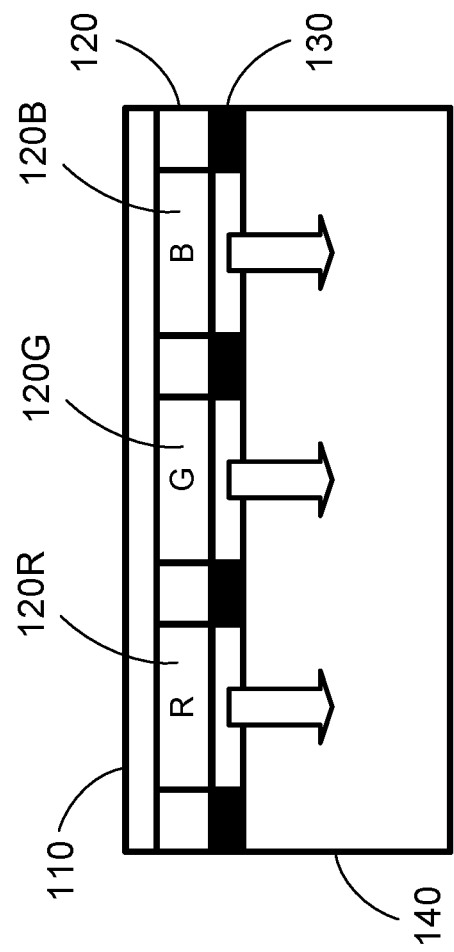
FIG. 1A schematically shows a pixel of a light emitting diode (LED) display panel using red (R), green (G) and blue (B) micro-LEDs according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a display panel and a display device using the same.

As discussed above, the micro-LED display is a potentially disruptive display technology because of its outstanding features such as low power consumption, good sunlight readability, true black state, high dynamic range and wide color gamut. In order to achieve full color micro-LED display, several approaches have been proposed. For example, FIG. 1A schematically shows a pixel of a LED display panel using red (R), green (G) and blue (B) micro-LEDs according to certain embodiments of the present disclosure. As shown in FIG. 1A, the LED display panel 100 includes a substrate 110, a plurality of LEDs 120 arranged in a LED array, a black matrix layer 130 and a passivation layer 140. The substrate 110 may be a transistor-based glass substrate, which may include the thin-film transistors (TFT) and other circuitry components forming the pixel circuit. The LED array formed by the LEDs 120 functions as a light emitting layer, and the LEDs 120 in the pixel include a red (R) micro-LED 120R, a green (G) micro-LED 120G, and a blue (B) micro-LED 120B, thus forming a RGB pixel with three sub-pixels. Specifically, the LEDs 120 may be formed by growing the micro-LEDs on different wafers, and then assembling the micro-LEDs in a matrix on the substrate 110. The black matrix layer 130 includes a plurality of holes corresponding to the LEDs 120, such that the light emitted by the LEDs 120 may pass through the holes of the black matrix layer 130, and the gaps between the LEDs 120 are blocked by the black matrix layer 130 to avoid light leakage. The LED display panel 100 as shown in FIG. 1A may have the beneficial features of high NTSC. However, in the LED display panel 100, the LEDs 120 require precise alignment for each pixel, and may require a relatively long transfer time to transfer all of the LEDs 120 onto the substrate 110. Further, the light emission efficiency and degradation rate of the RGB micro-LEDs 120 are different, such that it may need complicated driving circuit to maintain the color rendering index during operation.

FIG. 1B schematically shows a pixel of a LED display panel using white micro-LEDs and color filters according to certain embodiments of the present disclosure. As shown in FIG. 1B, the LED display panel 100' includes a substrate 110, a plurality of white micro-LEDs 122, a black matrix layer 130, a passivation layer 140, and a color filter layer 150. Specifically, the substrate 110, the black matrix layer 130 and the passivation layer 140 as shown in FIG. 1B are identical to the substrate 110, the black matrix layer 130 and the passivation layer 140 as shown in FIG. 1A, and are thus not further elaborated therein. The white micro-LEDs 122 are used to replace the LEDs 120 as shown in FIG. 1A, such that all the micro-LEDs 122 emit light in a single color (i.e., the white color). Since the white micro-LEDs 122 emit only white light, the color filter layer 150 is additionally required, such that the white light passing the color filters in the color filter layer 150 becomes corresponding RGB lights. In this case, the white micro-LEDs 122 do not require precise alignment, thus requiring a relatively short transfer time. However, the addition of the color filter layer 150 results in an increase of the overall thickness of the LED display panel 100'.

Figure 1C:
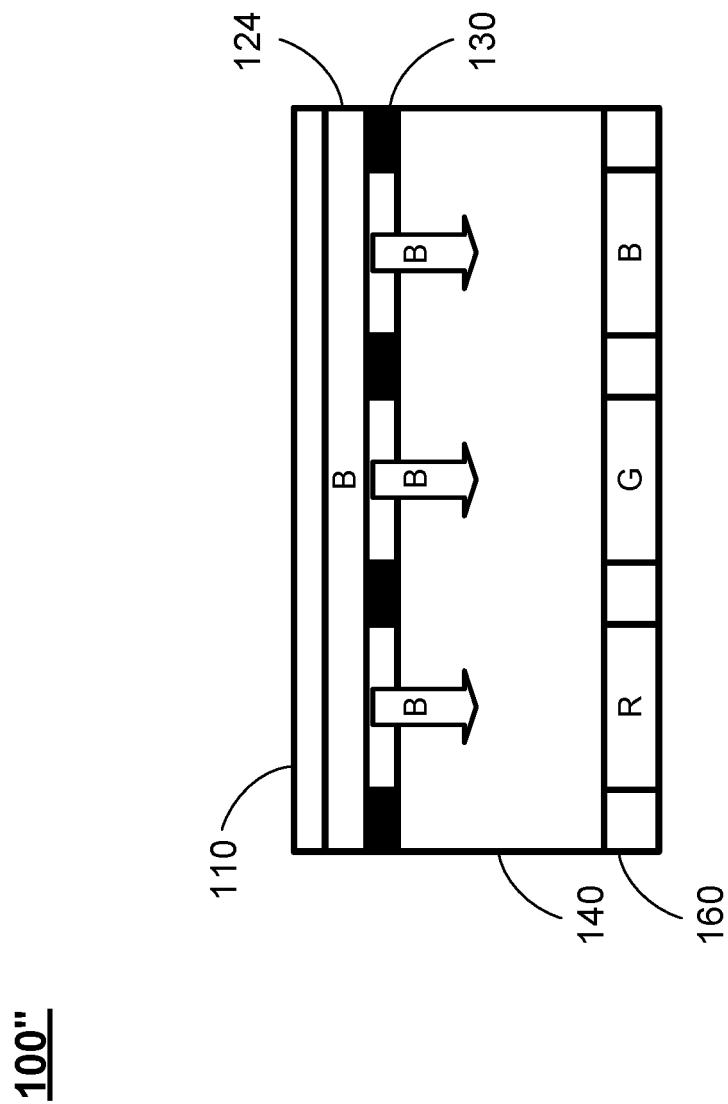
FIG. 1C schematically shows a pixel of a LED display panel using blue (B) micro-LEDs and color change mediums according to certain embodiments of the present disclosure.

Alternatively, FIG. 1C schematically shows a pixel of a LED display panel using blue (B) micro-LEDs and color change mediums according to certain embodiments of the present disclosure. As shown in FIG. 1C, the LED display panel 100" includes a substrate 110, a plurality of blue (B) micro-LEDs 124, a black matrix layer 130, a passivation layer 140, and a color change medium (CCM) layer 160. Specifically, the substrate 110, the black matrix layer 130 and the passivation layer 140 as shown in FIG. 1C are identical to the substrate 110, the black matrix layer 130 and the passivation layer 140 as shown in FIG. 1A, and are thus not further elaborated therein. The blue micro-LEDs 124 are used to replace the LEDs 120 as shown in FIG. 1A or the white micro-LEDs 122 as shown in FIG. 1B, such that all the micro-LEDs 124 emit light in a single color (i.e., the blue color). Since the blue micro-LEDs 122 emit only blue light, the CCM layer 160 is additionally required, such that the color change medium in the CCM layer 160 may be excited by the blue light to generate corresponding RGB lights. In certain embodiments, for the red (R) and green (G) sub-pixels, the color change medium in the CCM layer 160 may include phosphors or quantum materials such as quantum dots (QDs) that can be excited by the blue light to emit corresponding red or green lights. In this case, the blue micro-LEDs 124 do not require precise alignment, thus requiring a relatively short transfer time and providing higher efficiency. Further, the blue micro-LEDs 124 generally have longer life time relatively. However, the CCM layer 160 may have relatively lower color change medium efficiency.

In each of the embodiments as discussed above, there is still some remaining critical bottlenecks which need to be overcome for the high volume manufacturing of the micro-LED display panel. For example, in a 4K display (which is currently rapidly developed and used in televisions and smartphones), when the display utilizes the pixel structure as shown in FIG. 1A, the total quantity of the micro-LED chips being used in such a display may reach about 24.9 million. Thus, the traditional manufacturing method for the 4K display to pick and place equipment may result in a total time of about ~1000 hours, which is about 41 days. Further, the size of the micro-LED chips being used in the 4K display may be smaller than 10 um, and positioning accuracy of the micro-LED chips will be challenging.

In one aspect of the present disclosure, a LED display panel is provided in order to reduce the quantity of the micro-LEDs using shutter technology. In certain embodiments, the display panel as shown in FIG. 1C may be modified to add a micro-electromechanical system (MEMS) shutter layer between the micro-LEDs and CCM layer, and in each pixel, the MEMS shutter layer include shutter structures corresponding to the RGB sub-pixels that may be controlled individually to open and close.

Figure 2:
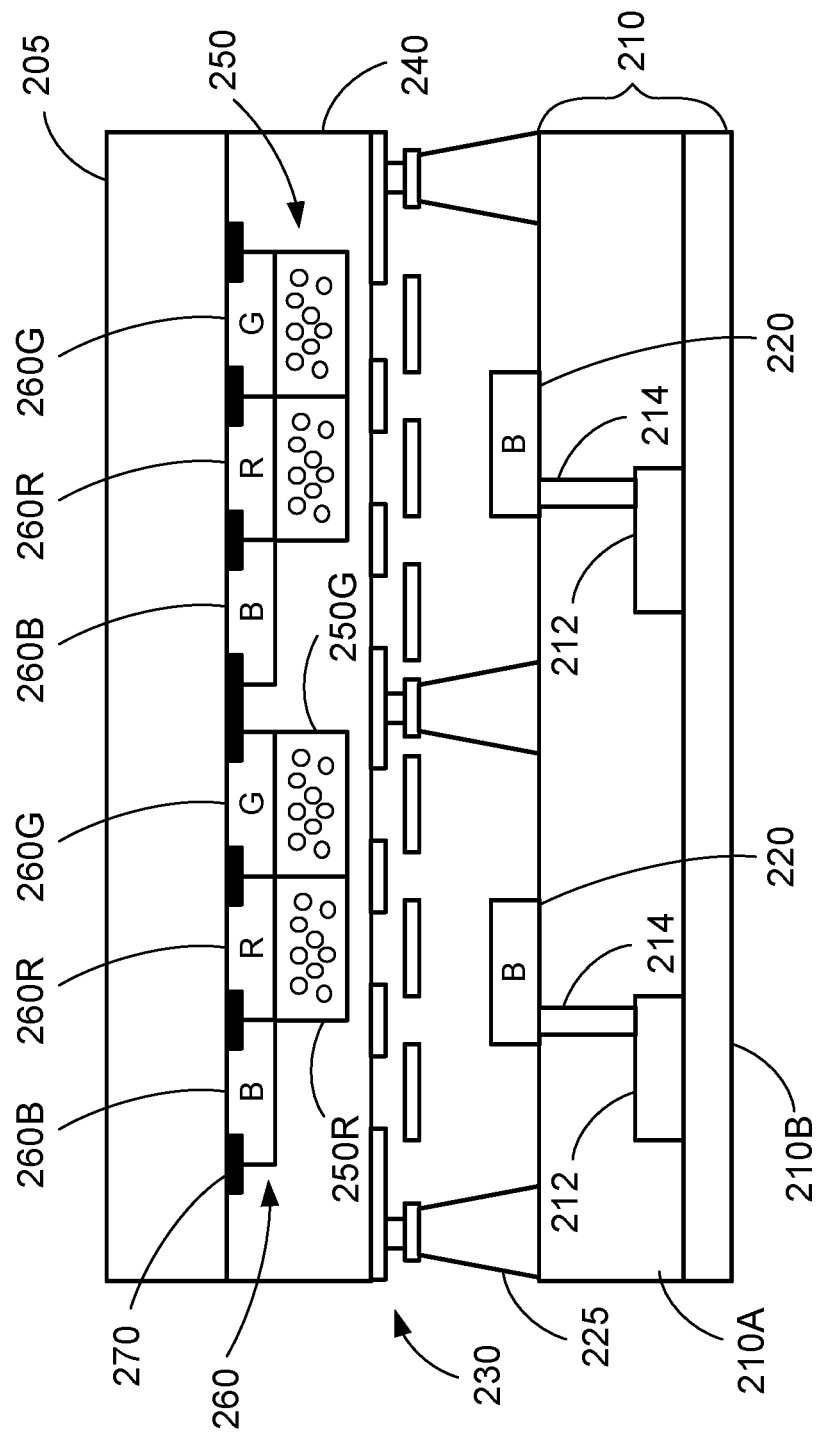
FIG. 2 schematically shows a LED display panel according to certain embodiments of the present disclosure.

FIG. 2 schematically shows a LED display panel according to certain embodiments of the present disclosure. Specifically, FIG. 2 shows two pixels in the LED display panel 200, where each pixel includes three sub-pixels in a red (R) color (i.e., a first color), a green (G) color (i.e., a second color) and a blue (B) color (i.e., a third color). As shown in FIG. 2, the LED display panel 200 includes two substrates 205 and 210 opposite to each other. The substrate 210 is a TFT-based substrate located at the back side (i.e., the lower side of FIG. 2) of the LED display panel 200, and the substrate 205 is located at the display side (i.e., the upper side of FIG. 2) of the LED display panel 200. Specifically, the substrate 210 is a two-layered TFT-based substrate formed by two layers 210A and 210B, such that the TFTs 212 can be formed between the two layers 210A and 210B. In each pixel, the TFTs 212 and corresponding connecting lines 214 are provided, forming an active matrix TFT backplane on the substrate 210. Further, a blue micro-LED 220 is electrically connected to the TFTs 212 via the connecting line 214. On the substrate 205, a black matrix layer 270, a color filter layer 260 and a color change layer 250 are provided. For each pixel, the color filter layer 260 include color filter structures 260B, 260R and 260G respectively corresponding to the blue (B), red (R) and green (G) sub-pixels, and the black matrix layer 270 include the black matrix structures disposed between the color filter structures in the color filter layer 260. Further, for each pixel, the color change layer 250 includes color change structures 250R (i.e., a first color change structure) and 250G (i.e., a second color change structure) respectively corresponding to the red (R) and green (G) sub-pixels, and there is no color change structure corresponding to the blue (B) sub-pixel. In certain embodiments, for the red (R) sub-pixel, the color change structure 250R in the color change layer 250 may be a red color converter to convert the blue light emitted by the micro-LED 220 to the red light, and for the green (G) sub-pixel, the color change structure 250G in the color change layer 250 may be a green color converter to convert the blue light emitted by the micro-LED 220 to the green light. For example, the color change structures 250R and 250G may include phosphor structures or quantum material structures such as quantum dots (QDs) that can be excited by the blue light to emit corresponding red or green lights. In one embodiment, the color change structure 250R corresponding to the red (R) sub-pixel may be a red QD structure, and the color change structure 250G corresponding to the green (G) sub-pixel may be a green QD structure. In certain embodiments, the color filter structures 260B, 260R and 260G may also be considered as a part of the color change structures. A passivation layer 240, which functions as an overcoat layer, is provided to cover the black matrix layer 270, the color filter layer 260 and the color change layer 250. Moreover, a shutter layer 230 is formed on the passivation layer 240 facing the blue micro-LEDs 220, and multiple spacers 225 are provided between the substrate 210 and the passivation layer 240 such that the blue micro-LEDs 220 and the shutter layer 230 are separated from each other. In certain embodiments, the shutter layer 230 may be implemented by a MEMS shutter layer. In certain embodiments, the spacers 225 may be reflective structures, and the surfaces of the spacers 225 are respectively reflective surfaces, such that the blue light emitted by the blue micro-LEDs 220 may be reflected toward the display side of the LED display panel 200. Thus, the LED display panel 200 as shown in FIG. 2 requires only one blue micro-LED 220 for the RGB sub-pixels of each pixel.

Figure 3A:
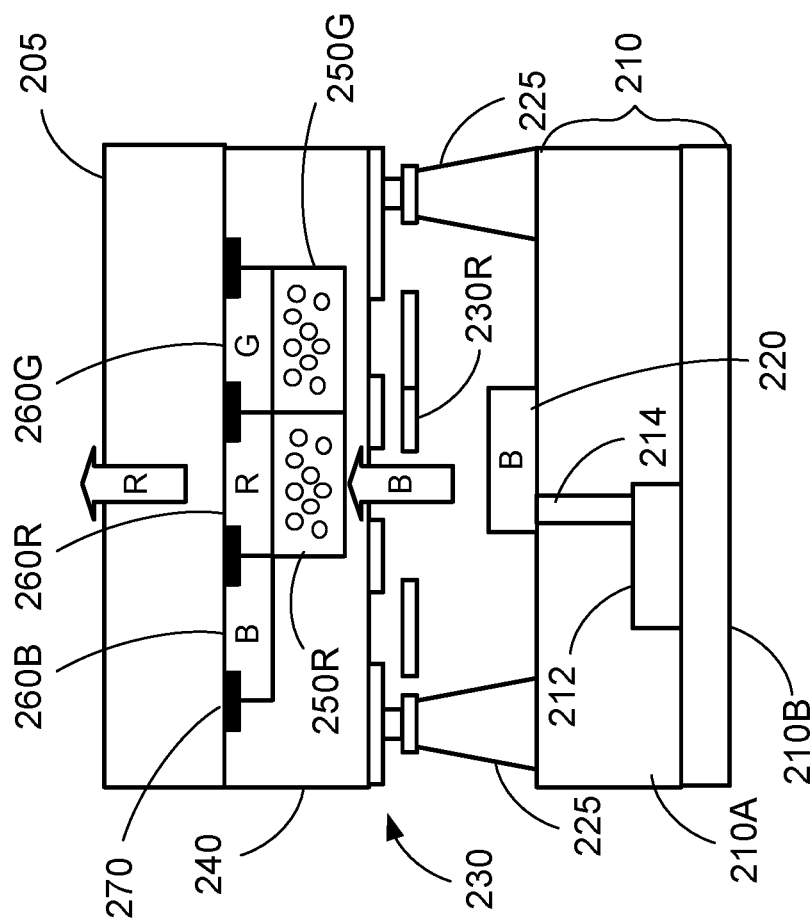
FIG. 3A schematically shows a pixel of the LED display panel as shown in FIG. 2 in a first one-third frame according to certain embodiments of the present disclosure.
Figure 3B:
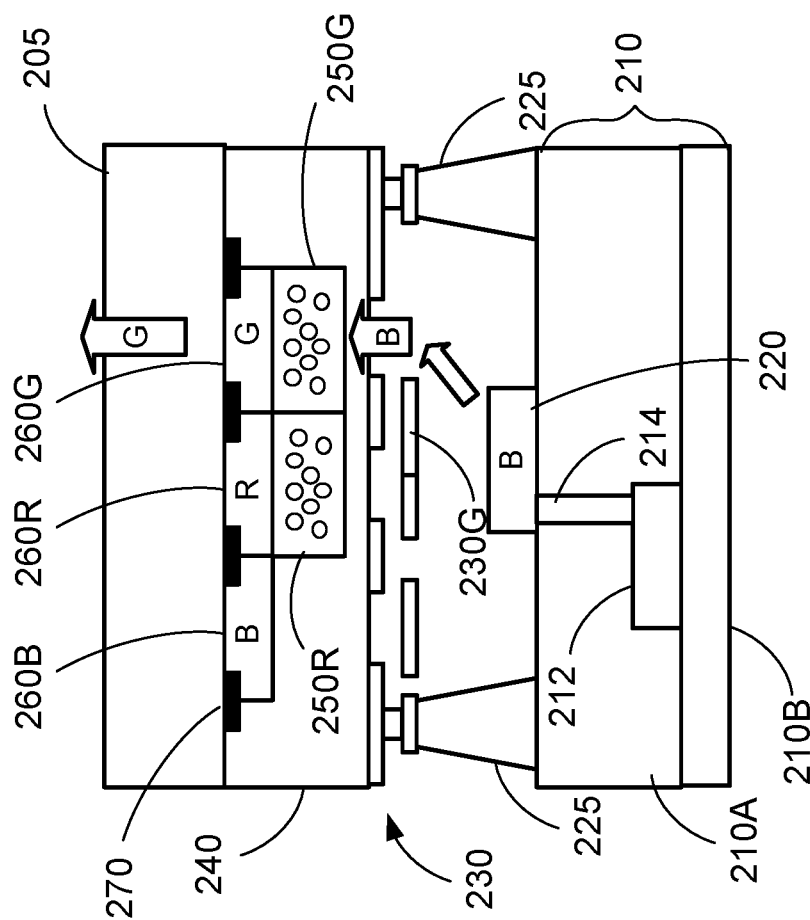
FIG. 3B schematically shows the pixel of the LED display panel as shown in FIG. 2 in a second one-third frame according to certain embodiments of the present disclosure.
Figure 3C:
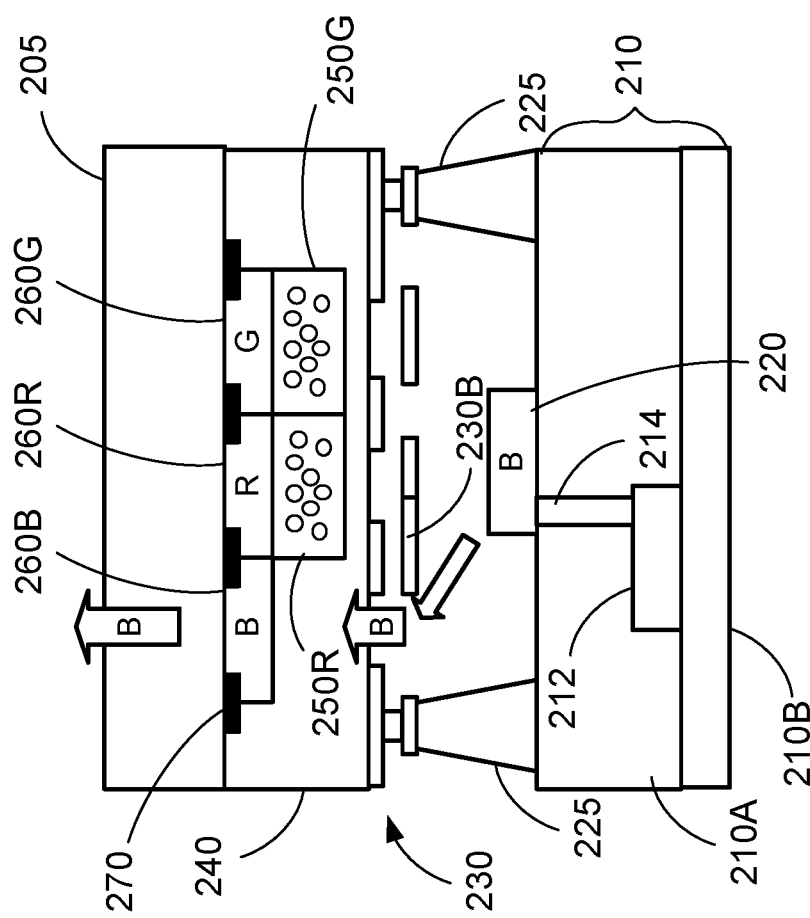
FIG. 3C schematically shows the pixel of the LED display panel as shown in FIG. 2 in a third one-third frame according to certain embodiments of the present disclosure.

FIGS. 3A to 3C schematically show a pixel of the LED display panel as shown in FIG. 2 in a frame. Specifically, as shown in FIGS. 3A to 3C, for each pixel, the shutter layer 230 includes a plurality of shutter structures 230R, 230G and 230B correspondingly aligned to the RGB sub-pixels. Each of the shutter structures 230R, 230G and 230B is independently controlled to be switchable between a first state (which is a closed state) and a second state (which is an open state). Specifically, as shown in FIG. 2, all of the shutter structures in the shutter layer 230 are in the first state (i.e., the closed state), such that the blue light emitted by the corresponding blue micro-LED 220 is reflected or blocked by each respective shutter structure in the first state from reaching the corresponding color change structure and/or the corresponding color filter structure.

As shown in FIG. 3A, the shutter structure 230R, which corresponds to the red (R) sub-pixel, is switched to the second state (i.e., the open state), such that the blue light emitted by the corresponding blue micro-LED 220 is allowed to pass through the shutter structure 230R in the second state to reach the color change structure 250R and the corresponding color filter structure 260R. In this case, the color change structure 250R will be excited by the blue light to generate red light. Meanwhile, the other two shutter structures 230G and 230B remain in the first state (i.e., the closed state), such that the blue light emitted by the corresponding blue micro-LED 220 is reflected or blocked by the shutter structures 230G and 230B in the first state from reaching the corresponding color change structure 250G and the corresponding color filter structures 260G and 260B.

As shown in FIG. 3B, the shutter structure 230G, which corresponds to the green (G) sub-pixel, is switched to the second state (i.e., the open state), such that the blue light emitted by the corresponding blue micro-LED 220 is allowed to pass through the shutter structure 230G in the second state to reach the color change structure 250G and the corresponding color filter structure 260G. In this case, the color change structure 250G will be excited by the blue light to generate green light. Meanwhile, the other two shutter structures 230R and 230B remain (or are switched to) the first state (i.e., the closed state), such that the blue light emitted by the corresponding blue micro-LED 220 is reflected or blocked by the shutter structures 230R and 230B in the first state from reaching the corresponding color change structure 250R and the corresponding color filter structures 260R and 260B.

As shown in FIG. 3C, the shutter structure 230B, which corresponds to the blue (B) sub-pixel, is switched to the second state (i.e., the open state), such that the blue light emitted by the corresponding blue micro-LED 220 is allowed to pass through the shutter structure 230B in the second state to reach the corresponding color filter structure 260B. In this case, the blue light will pass directly through the color filter structure 260B, since there is no corresponding color change structure in the blue (B) sub-pixel. Meanwhile, the other two shutter structures 230R and 230G remain (or are switched to) the first state (i.e., the closed state), such that the blue light emitted by the corresponding blue micro-LED 220 is reflected or blocked by the shutter structures 230R and 230G in the first state from reaching the corresponding color change structure 250R and 250G and the corresponding color filter structures 260R and 260G.

As shown in FIGS. 3A to 3C, for each of the pixels, only the shutter structure corresponding to one of the RGB sub-pixels is in the second state (i.e., the open state), and the shutter structures corresponding to the other two of the RGB sub-pixels are in the first state (i.e., the closed state). For example, as shown in FIG. 3A, only the shutter structure 230R is in the second state; as shown in FIG. 3B, only the shutter structure 230G is in the second state; and as shown in FIG. 3C, only the shutter structure 230B is in the second state. Further, the respective shutter structure corresponding to each of the RGB sub-pixels are in the second state (i.e., the open state) for one-third of a display frame. For example, FIG. 3A shows the pixel to be in a first one-third frame, FIG. 3B shows the pixel to be in a second one-third frame, and FIG. 3C shows the pixel to be in a third one-third frame. In other words, in the first one-third frame as shown in FIG. 3A, the shutter structure 230R corresponding to the red (R) sub-pixel is in the second state, and the shutter structures 230G and 230B corresponding to the other two sub-pixels are in the first state; in the second one-third frame as shown in FIG. 3B, the shutter structure 230G corresponding to the green (G) sub-pixel is in the second state, and the shutter structures 230R and 230B corresponding to the other two sub-pixels are in the first state; and in the third one-third frame as shown in FIG. 3C, the shutter structure 230B corresponding to the blue (B) sub-pixel is in the second state, and the shutter structures 230R and 230G corresponding to the other two sub-pixels are in the first state. In this case, the pixel may allow light in all of the RGB colors to be emitted in a whole display frame.

Figure 4H:
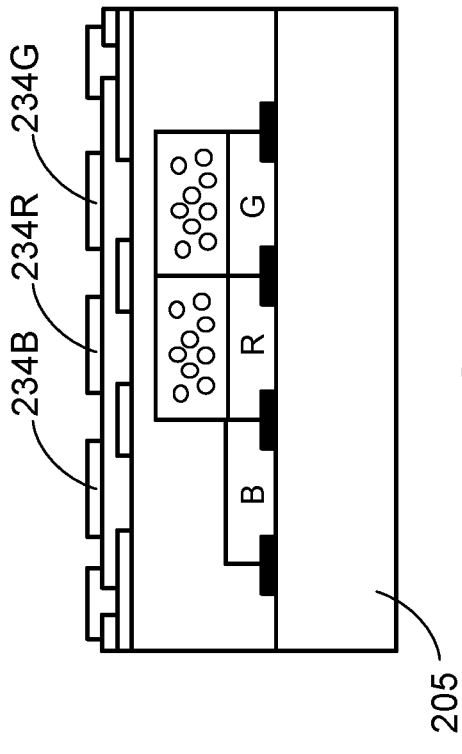

FIGS. 4A-4J schematically show a manufacturing process of the LED display panel as shown in FIG. 2 according to certain embodiments of the present disclosure. As shown in FIG. 4A, the black matrix layer 270 is formed on the substrate 205. Then, as shown in FIG. 4B, the color filter layer 260 is formed on the substrate 205, such that the black matrix structures of the black matrix layer 270 are disposed between the color filter structures in the color filter layer 260. In other words, the color filter structures of the color filter layer 260 are disposed on the portions of the substrate 205 not covered by the black matrix layer 270. Subsequently, as shown in FIG. 4C, the color change structures 250R and 250G are formed respectively on the color filter structures 260R and 260G, while no corresponding color change structure is formed on the color filter structure 260B. As shown in FIG. 4D, the passivation layer 240 is formed to cover the black matrix layer 270, the color filter layer 260 and the color change layer 250.

Figure 4I:
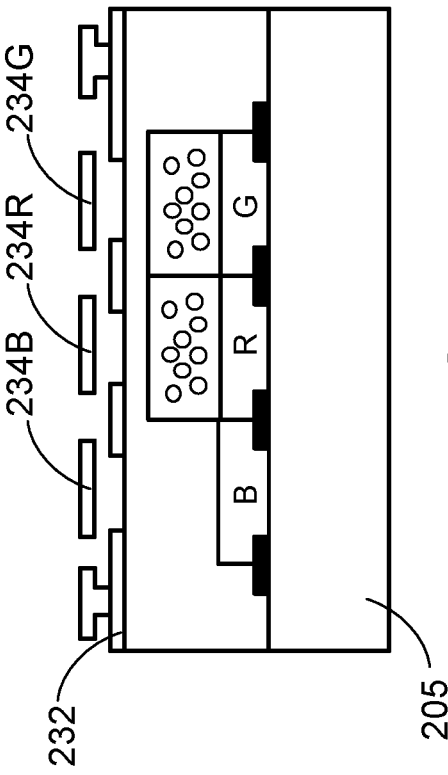
Figure 4F:
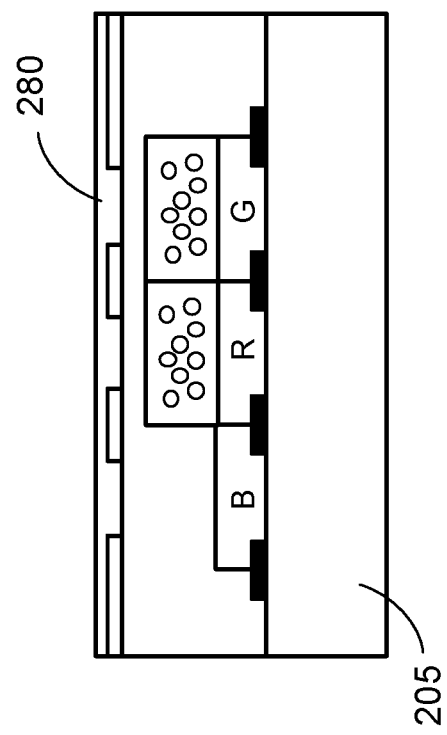
Figure 4G:
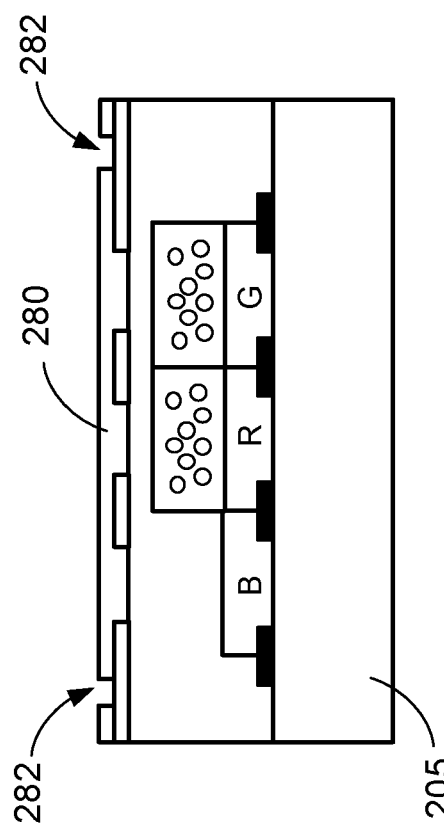
Figure 4J:
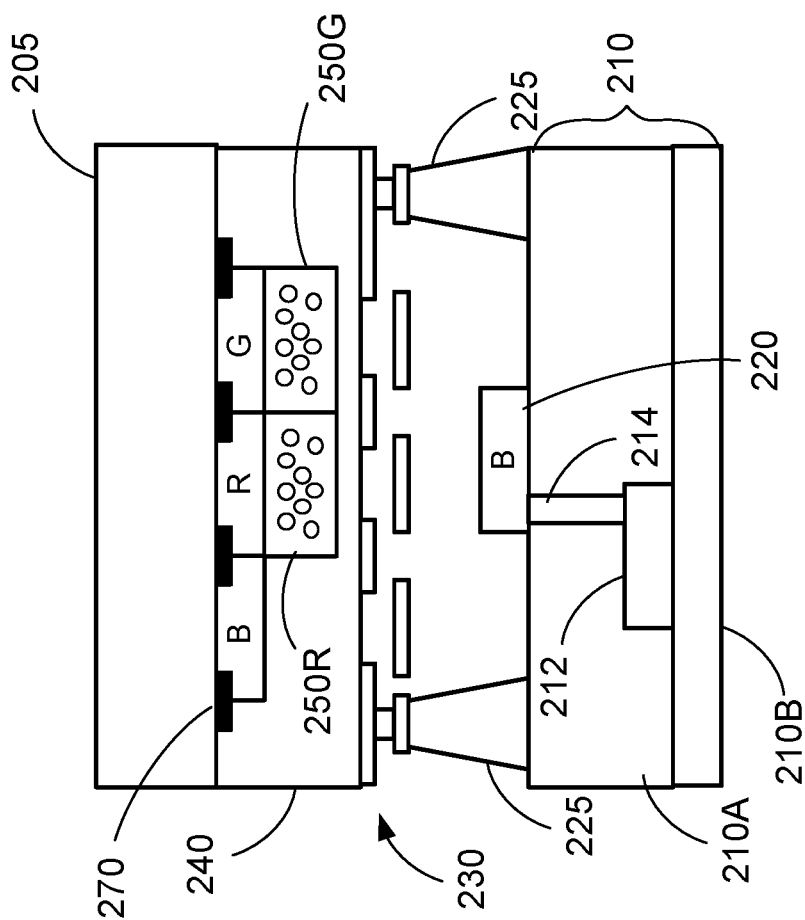

Then, as shown in FIGS. 4E to 4I, the shutter layer 230 is formed on the passivation layer 240. Specifically, as shown in FIG. 4E, a shielding layer 232 is formed on the passivation layer 240, and the shielding layer 232 has openings corresponding to each of the RGB sub-pixels. As shown in FIG. 4F, an anchor layer 280 is disposed on the shielding layer 232. The anchor layer 280 is patterned to create anchor holes for the shutter layer 230, and is formed with a sacrificial material which may be removed later. As shown in FIG. 4G, a plurality of holes 282 are formed on the anchor layer 280, such that each hole 282 may expose a portion of the shielding layer 232. As shown in FIG. 4H, a MEMS micro-shutter layer is patterned on the anchor layer 280, thus forming a plurality of micro-shutters 234R, 234G and 234B corresponding to the RGB sub-pixels. As shown in FIG. 4I, the anchor layer 280 is then removed, such that the shielding layer 232 and the micro-shutters 234R, 234G and 234B correspondingly form the shutter layer 230. Once the shutter layer 230 is formed, as shown in FIG. 4J, the structure as shown in FIG. 4I is flipped upside-down and assembled with the substrate 210, on which the active matrix TFT backplane is formed and the blue micro-LED 220 and the spacers 225 are disposed, thus forming the LED display panel 200.

Figure 5A:
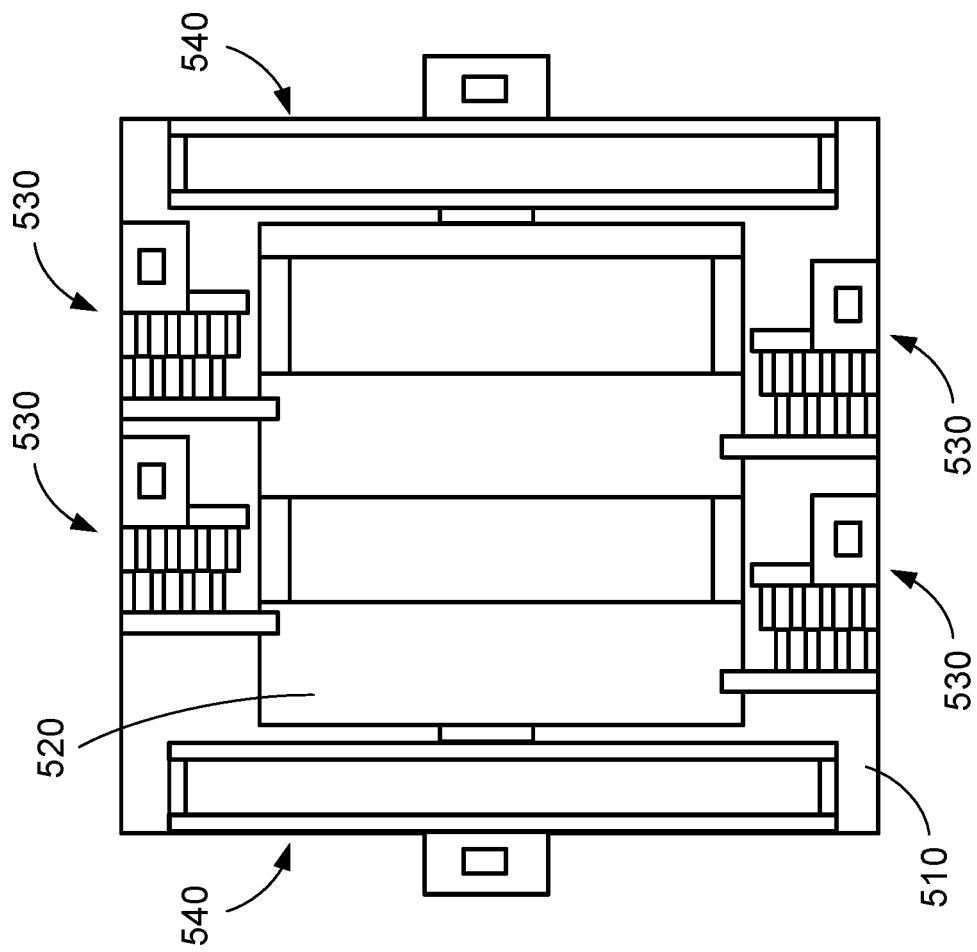
FIG. 5A schematically shows a top view of a MEMS shutter structure according to certain embodiments of the present disclosure.

As discussed above, the shutter layer 230 may be implemented by a MEMS shutter layer. FIGS. 5A to 5G schematically show a MEMS shutter structure in a MEMS shutter layer and the components thereof according to certain embodiments of the present disclosure. Specifically, the MEMS shutter structure 500 as shown in FIG. 5A constitutes a shutter structure corresponding to one sub-pixel. As shown in FIG. 5A, the MEMS shutter structure 500 includes a shielding layer 510, a shutter 520, four electrostatic actuators 530 and two spring structures 540. Specifically, the shutter 520, the electrostatic actuators 530 and the spring structures 540 correspondingly constitute a micro-shutter, which may be one of the micro-shutters 234R, 234G and 234B as shown in FIG. 4I.

Figure 5C:
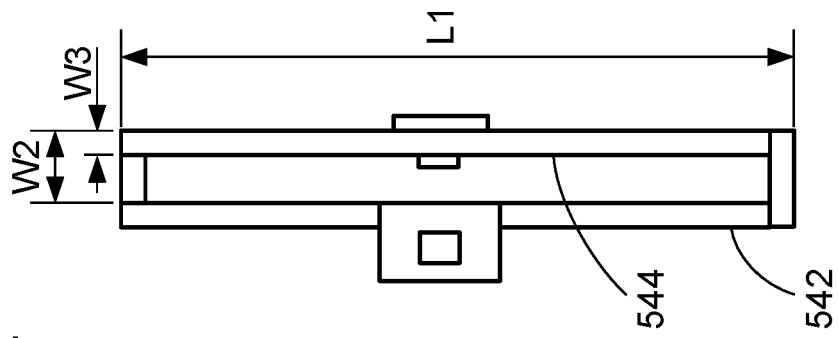
FIG. 5C schematically shows a spring structure of the MEMS shutter structure as shown in FIG. 5A.
Figure 5B:
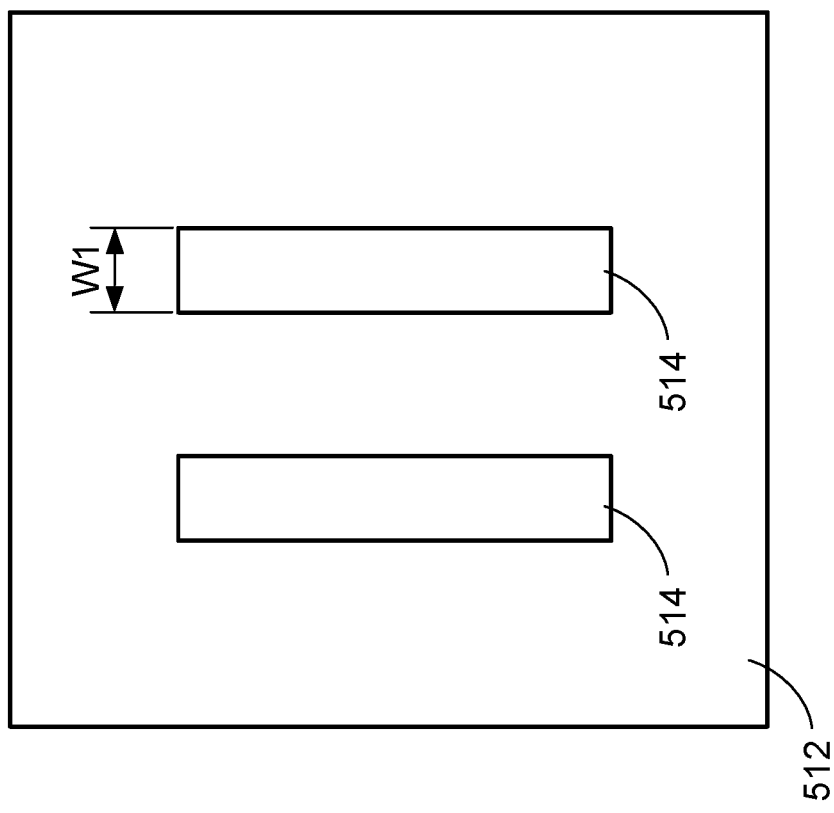
FIG. 5B schematically shows a shielding layer of the MEMS shutter structure as shown in FIG. 5A.

As shown in FIG. 5B, the shielding layer 510 includes a shielding plate 512 and a plurality of openings 514. The openings 514 are apertures aligned to the corresponding sub-pixel such that the color change structure and the color filter structure of the corresponding sub-pixel may be at least partially exposed in the openings 514. Specifically, FIG. 5B shows two openings 514. However, the quantity of the openings 514 may vary. In certain embodiments, as shown in FIG. 5B, the width W1 of each of the openings 514 may be in a range between 5 um and 50 um. For example, in one embodiment, the width W1 may be about 10 um.

Figure 5E:
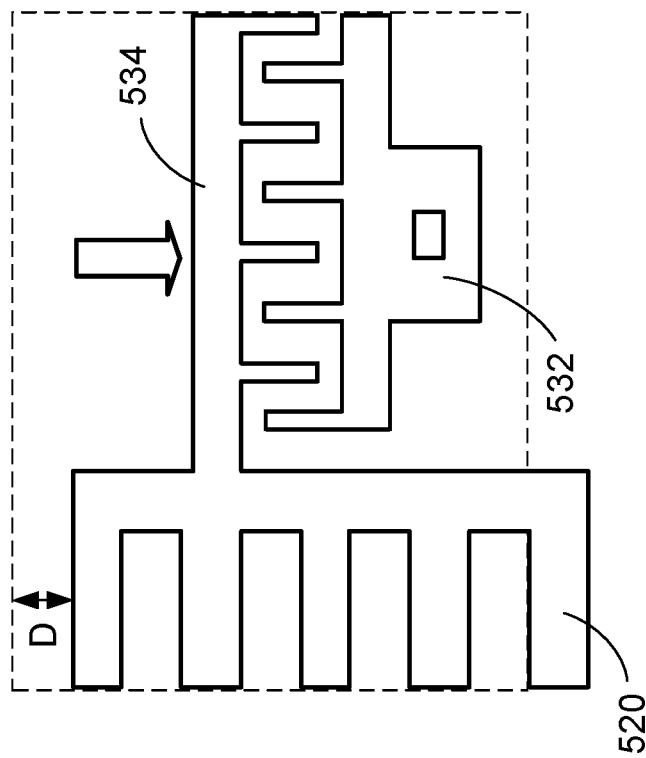
FIG. 5E schematically shows an electrostatic actuator and a portion of a shutter of the MEMS shutter structure as shown in FIG. 5A, where the shutter is located at a second position.
Figure 5D:
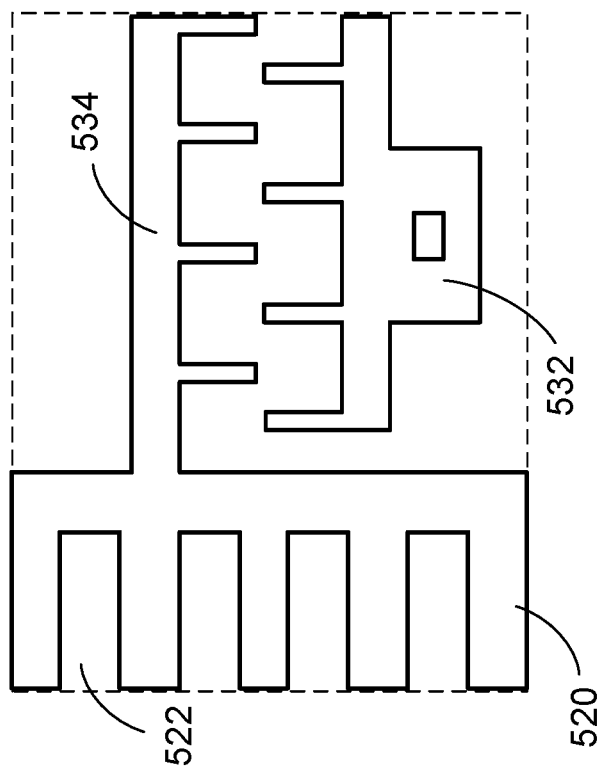
FIG. 5D schematically shows an electrostatic actuator and a portion of a shutter of the MEMS shutter structure as shown in FIG. 5A, where the shutter is located at a first position.

As shown in FIGS. 5D to 5G, the shutter 520 is a shutter plate having multiple openings 522 corresponding to the openings 514 of the shielding layer 510. Specifically, the shutter 520 is movable between a first position as shown in FIG. 5D and a second position as shown in FIG. 5E. When the MEMS shutter structure 500 is in the first state (i.e., the closed state), the shutter 520 moves to the first position, such that the shutter 520 blocks the openings 514 of the shielding layer 510. When the MEMS shutter structure 500 is in the second state (i.e., the open state), the shutter 520 moves to the second position, such that the openings 522 of the shutter 520 align to the openings 514 of the shielding layer 510, allowing the openings 514 to at least partially the color change structure and the color filter structure of the corresponding sub-pixel. In certain embodiments, as shown in FIG. 5E, the moving distance D between the first position and the second position is in a range between 5 um and 50 um, which is substantially equal to the width W1 of each of the openings 514. For example, in one embodiment, the distance D may be about 10 um. As shown in FIG. 5F, the thickness T of the shutter 520 is in a range between 0.1 um and 20 um. For example, in one embodiment, the thickness T may be about 10 um.

The spring structures 540 are flexible suspension structures connected to the two ends of the shutter 520 for supporting the shutter 520 to move between the first position and the second position. FIG. 5C shows one spring structure 540, which is substantially in a rectangular shape having a first bar portion 542 and a second bar portion 544 opposite to each other. Specifically, the first bar portion 542 is fixed relatively to the shielding layer 510, and the second bar portion 544 is fixed to the shutter 520. When the shutter 520 moves from the first position to the second position, the second bar portion 544 deforms and generates an elastic force, which may drive the shutter 520 to move from the second position back to the first position. In certain embodiments, the spring structure 540 has a length L1 and a width W2, and the first and second bar portions 542 and 544 may have a width W3. The length L1 and the widths W2 and W3 may be adjustable based on the width of the openings 514 and the moving distance D of the shutter 520 in order to provide a sufficient moving distance D of the shutter 520 while maintaining sufficient elasticity. For example, in one embodiment, when the moving distance D and the width W1 of the openings 514 are both about 10 um, the length L1 may be about 320 um, the width W2 may be about 12 um, and the width W3 may be about 2.5 um.

The electrostatic actuators 530 are configured to drive the shutter 520 to move between the first position as shown in FIG. 5D and the second position as shown in FIG. 5E. Specifically, FIG. 5A shows four electrostatic actuators 530. However, the quantity of the electrostatic actuators 530 may vary. FIGS. 5D and 5E respectively show one electrostatic actuator 530 according to certain embodiments of the present disclosure. As shown in FIGS. 5D and 5E, the electrostatic actuator 530 has a first portion 532 and a second portion 534. The first portion 532 is fixed to the shielding layer 510, and the second portion 534 is fixed to the shutter 520. An actuating voltage is configured to be provided to the first portion 532 of the electrostatic actuator 530 to generate an electrostatic field. When the actuating voltage is provided, the second portion 534 and the shutter 520 correspondingly move relatively to the first portion 532 toward the second position as shown in FIGS. 5E and 5G. When the actuating voltage is not provided, the elastic force generated by the spring structures 540 drive the shutter 520 to move from the second position back to the first position as shown in FIGS. 5D and 5F.

Figure 6B:
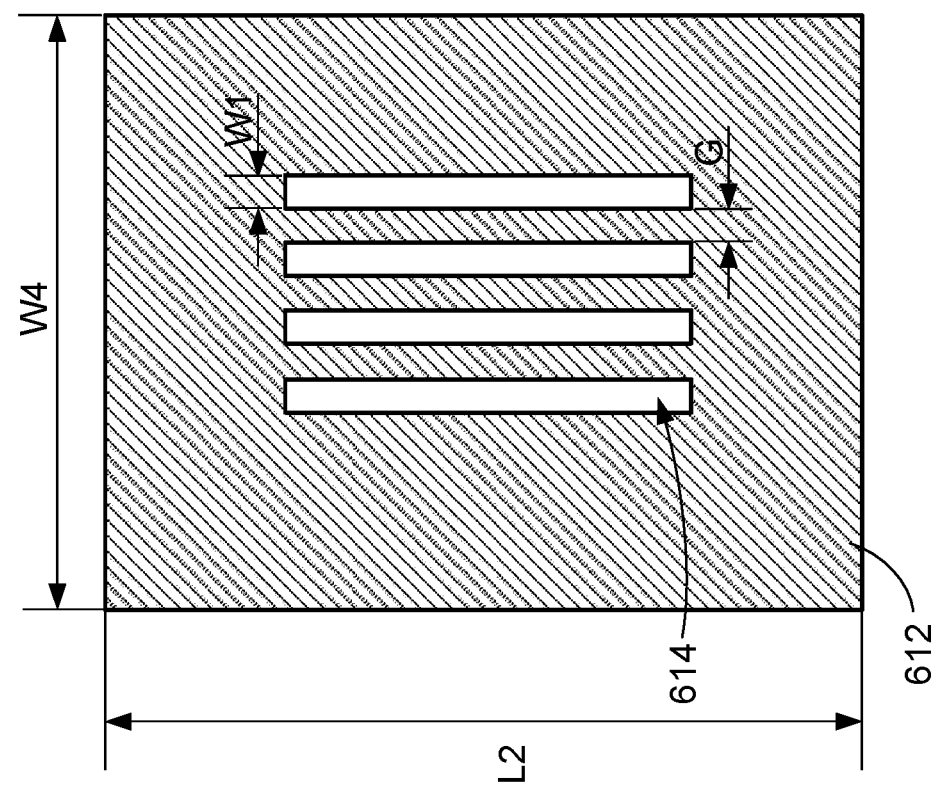
FIG. 6B schematically shows the shielding layer of the MEMS shutter structure as shown in FIG. 6A.

FIGS. 6A to 6D schematically show a MEMS shutter structure in a MEMS shutter layer according to another embodiment of the present disclosure. Specifically, the MEMS shutter structure 600 as shown in FIG. 6A constitutes a shutter structure corresponding to one sub-pixel. As shown in FIG. 6A, the MEMS shutter structure 600 includes a shielding layer 610, a shutter 620, four electrostatic actuators 630 and two spring structures 640. Specifically, the shutter 620, the electrostatic actuators 630 and the spring structures 640 correspondingly constitute a micro-shutter, which may be one of the micro-shutters 234R, 234G and 234B as shown in FIG. 4I. It should be noted that the FIG. 6A shows the shutter 620 located in the first position, while FIG. 6C shows the shutter 620 moving leftward to the second position, exposing the openings 614 of the shielding layer 610.

Figure 6D:
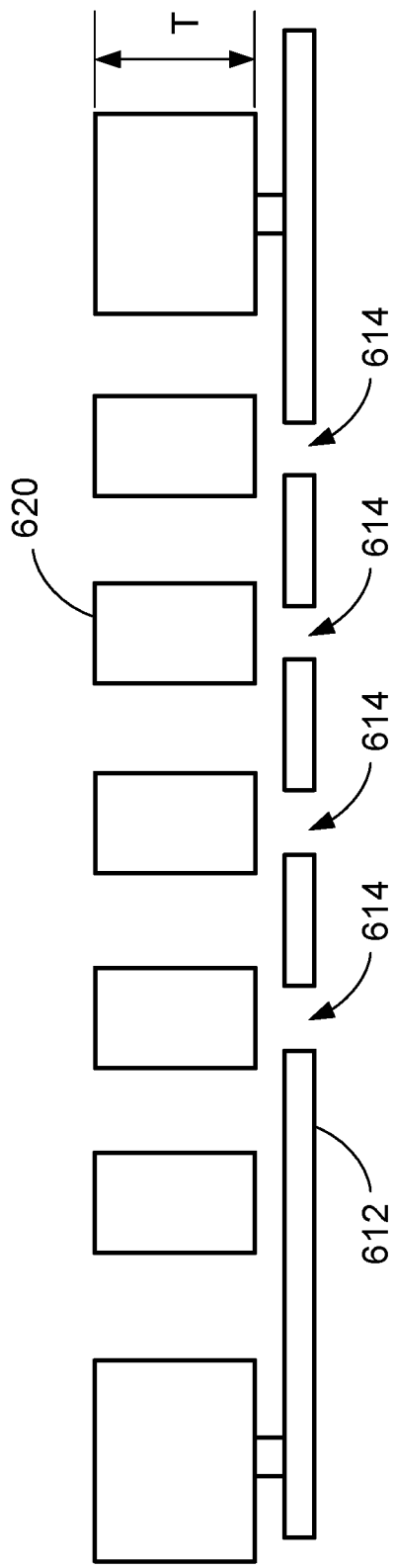
FIG. 6D schematically shows a cross-sectional view of the shutter and the shielding layer of the MEMS shutter structure as shown in FIG. 6A.

As shown in FIG. 6B to 6D, the shielding layer 610 has four openings 614. The shielding layer 610 has a length L2 and a width W4, each of the openings 614 has a width W1, and a gap distance G exists between two adjacent openings 614. In one embodiment, when the display panel is a 5.43" panel having a length of 110.4 mm and a height of 82.8 mm with a 240*320 RGB array, each of the RGB sub-pixels has a size of 0.345 mm*0.115 mm. Thus, the length L2 of the shielding layer 610 may be about 345 um, the width W4 of the shielding layer may be about 115 um, and the width W1 of the openings 614 and the gap distance G may both be about 10 um. The thickness of the shutter 620 may be about 15 um.

Figure 7A:
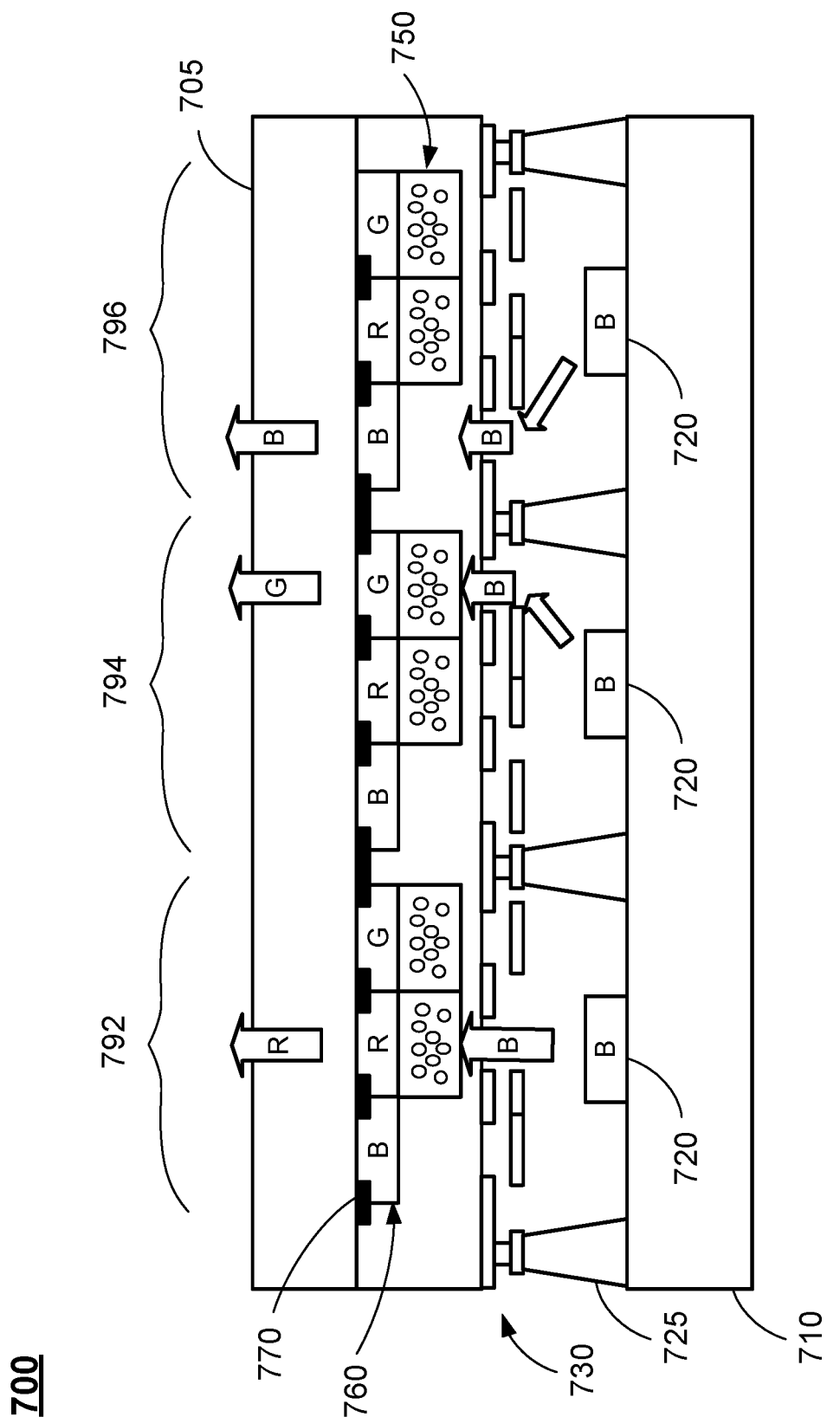
FIG. 7A schematically shows three pixels of a LED display panel with the color sequential feature in a first one-third frame according to certain embodiments of the present disclosure.
Figure 7B:
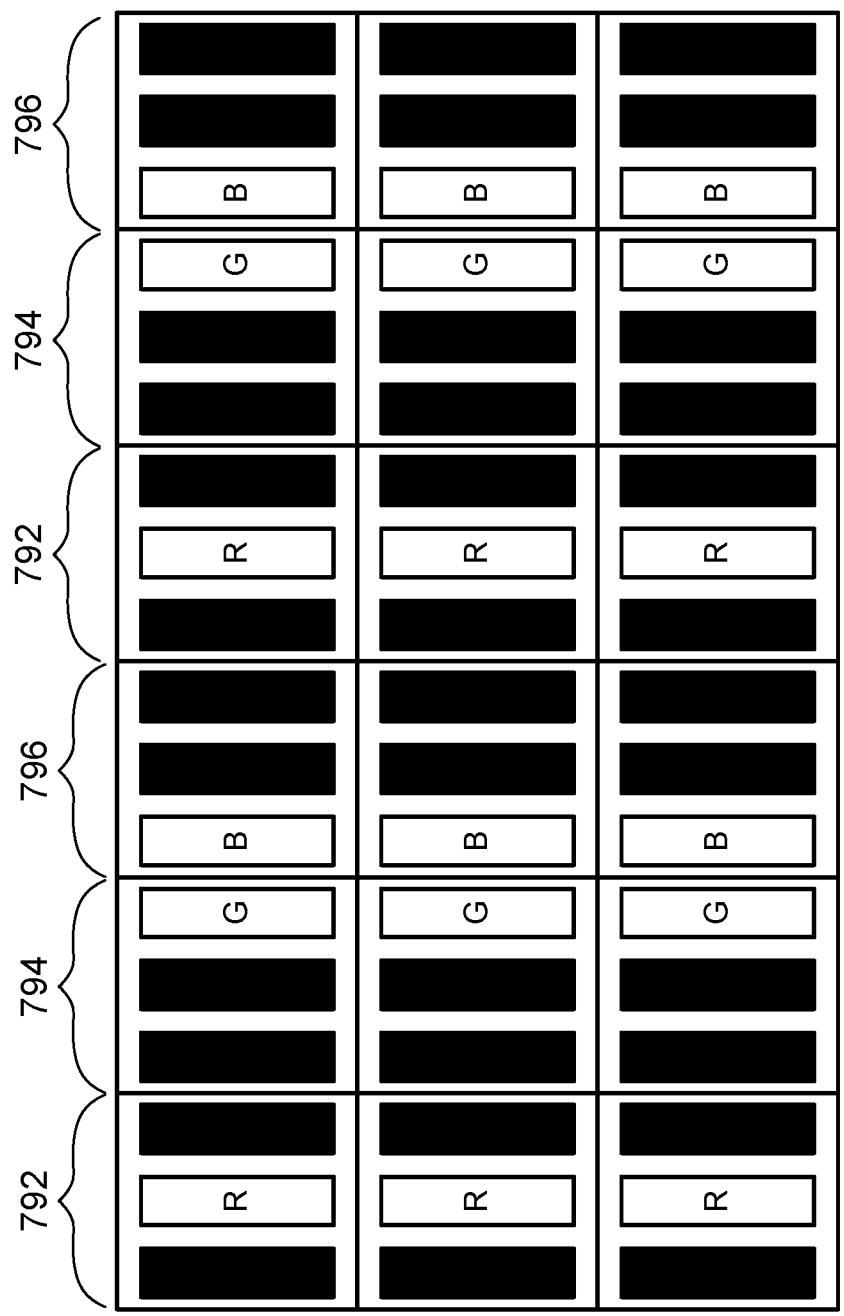
FIG. 7B schematically shows the sub-pixels of the LED display panel in the first one-third frame as shown in FIG. 7A.

In certain embodiments, the LED display panel 200 as shown in FIG. 2 may be provided with the color sequential feature. For example, FIGS. 7A to 7F schematically shows a LED display panel with the color sequential feature according to certain embodiments of the present disclosure. Specifically, as shown in FIG. 7A, the LED display panel 700 includes three adjacent pixels forming a pixel group, including a first pixel 792, a second pixel 794 and a third pixel 796. As shown in FIG. 7A, in the first one-third frame, the shutter structure corresponding to the red (R) sub-pixel of the first pixel 792 is in the second state (i.e., the open state), the shutter structure corresponding to the green (G) sub-pixel of the second pixel 794 is in the second state (i.e., the open state), and the shutter structure corresponding to the blue (B) sub-pixel of the third pixel 796 is in the second state (i.e., the open state). Meanwhile, the shutter structures corresponding to other sub-pixels of the first, second and third pixels 792, 794 and 796 are in the first state (i.e., the closed state). In this case, as shown in FIG. 7B, the first pixel 792 is configured to display only the red light corresponding to the red (R) sub-pixel, the second pixel 794 is configured to display only the green light corresponding to the green (G) sub-pixel, and the third pixel 796 is configured to display only the blue light corresponding to the blue (B) sub-pixel. Other structures as shown in FIG. 7A, such as the substrates 705 and 710, the blue micro-LEDs 720, the spacers 725, the shutter layer 730, the color change layer 750, the color filter layer 760, and the black matrix layer 770, are similar to the corresponding structures as shown in FIG. 2, such as the substrates 205 and 210, the blue micro-LEDs 220, the spacers 225, the shutter layer 230, the color change layer 250, the color filter layer 260, and the black matrix layer 270, and details of these structures are not further elaborated herein.

Figure 7C:
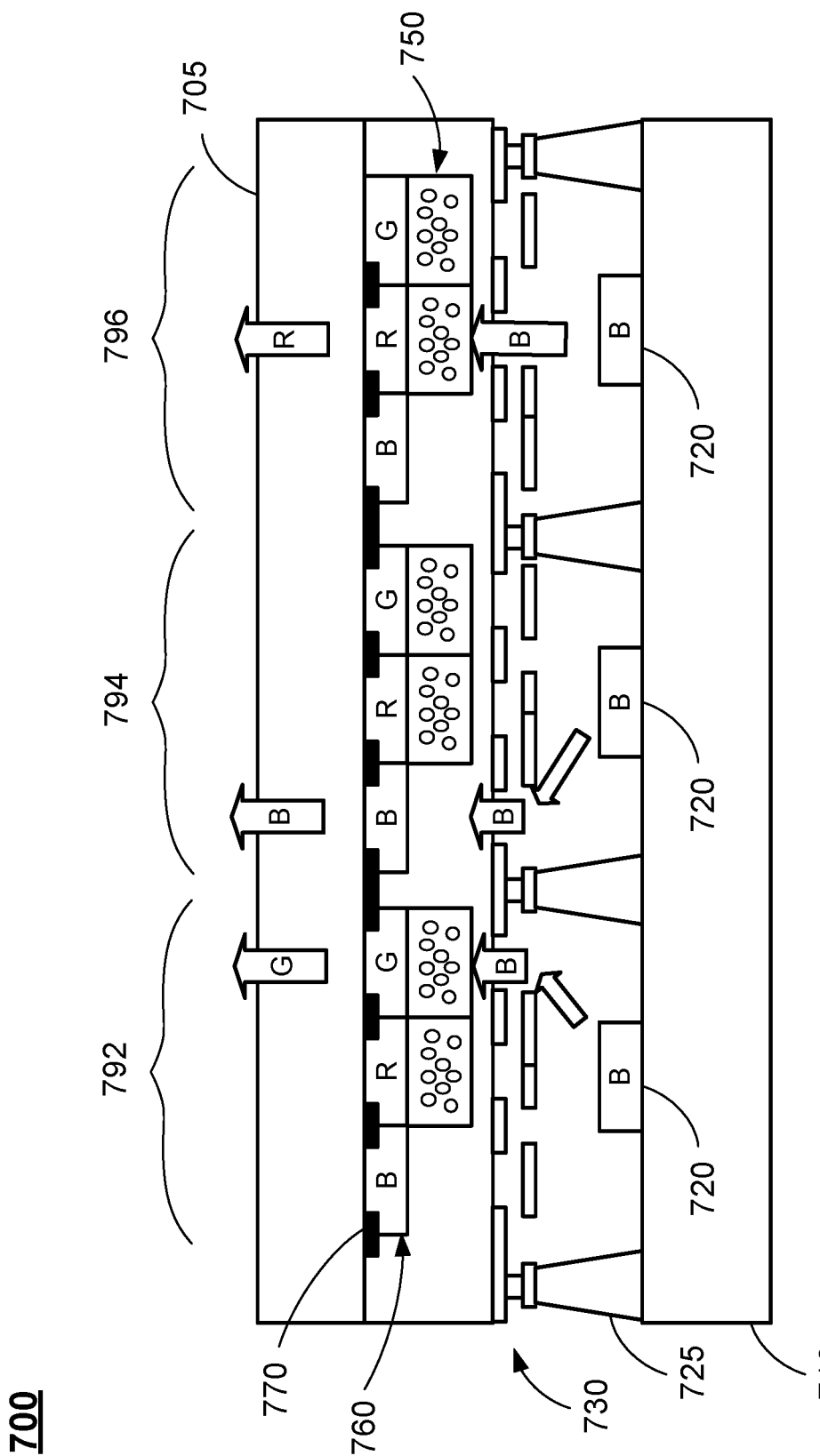
FIG. 7C schematically shows the three pixels of the LED display panel with the color sequential feature in a second one-third frame according to certain embodiments of the present disclosure.
Figure 7D:
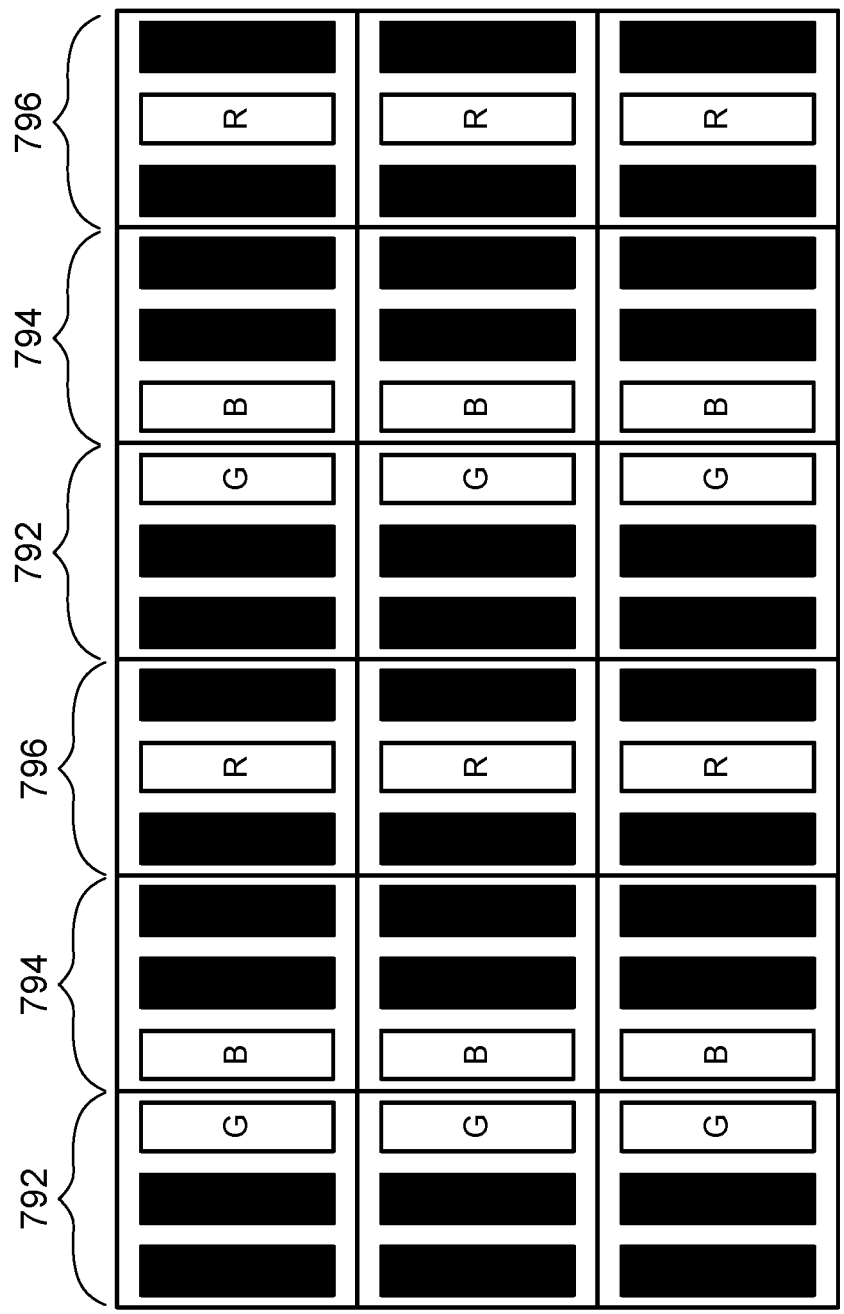
FIG. 7D schematically shows the sub-pixels of the LED display panel in the second one-third frame as shown in FIG. 7C.

As shown in FIG. 7C, in the second one-third frame, the shutter structure corresponding to the green (G) sub-pixel of the first pixel 792 is in the second state (i.e., the open state), the shutter structure corresponding to the blue (B) sub-pixel of the second pixel 794 is in the second state (i.e., the open state), and the shutter structure corresponding to the red (R) sub-pixel of the third pixel 796 is in the second state (i.e., the open state). Meanwhile, the shutter structures corresponding to other sub-pixels of the first, second and third pixels 792, 794 and 796 are in the first state (i.e., the closed state). In this case, as shown in FIG. 7D, the first pixel 792 is configured to display only the red light corresponding to the green (G) sub-pixel, the second pixel 794 is configured to display only the blue light corresponding to the blue (B) sub-pixel, and the third pixel 796 is configured to display only the red light corresponding to the red (R) sub-pixel.

Figure 7E:
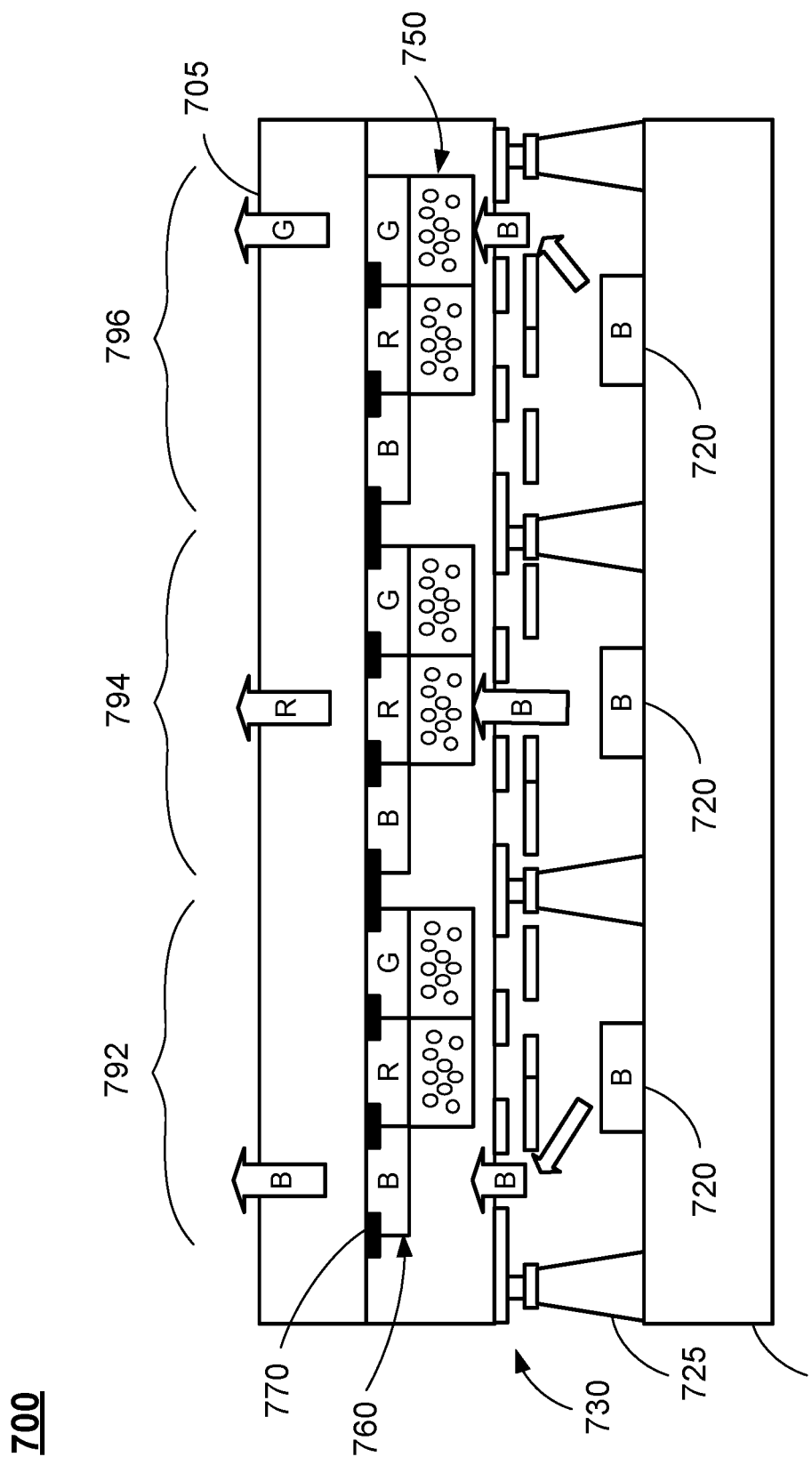
FIG. 7E schematically shows the three pixels of the LED display panel with the color sequential feature in a third one-third frame according to certain embodiments of the present disclosure.
Figure 7F:
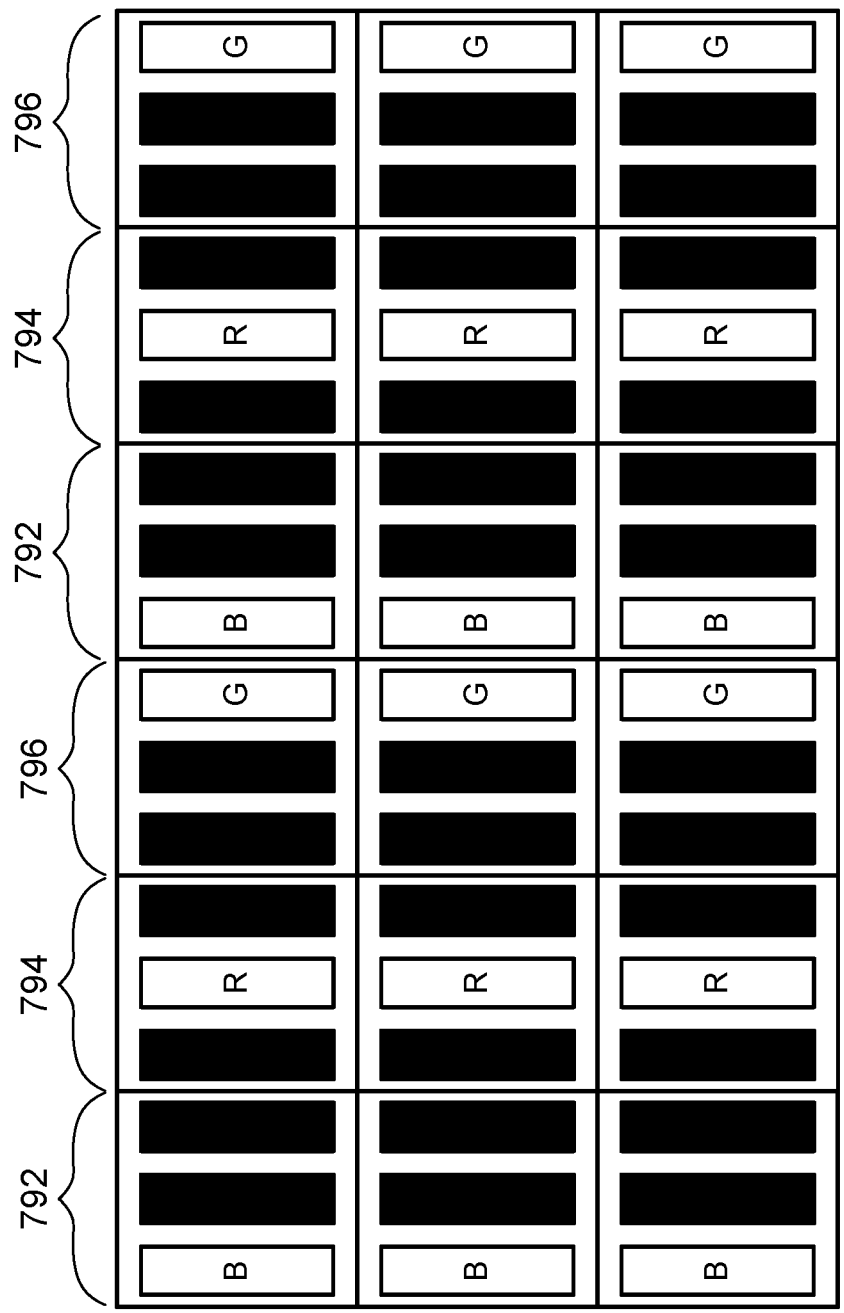
FIG. 7F schematically shows the sub-pixels of the LED display panel in the third one-third frame as shown in FIG. 7E.

As shown in FIG. 7E, in the first one-third frame, the shutter structure corresponding to the blue (B) sub-pixel of the first pixel 792 is in the second state (i.e., the open state), the shutter structure corresponding to the red (R) sub-pixel of the second pixel 794 is in the second state (i.e., the open state), and the shutter structure corresponding to the green (G) sub-pixel of the third pixel 796 is in the second state (i.e., the open state). Meanwhile, the shutter structures corresponding to other sub-pixels of the first, second and third pixels 792, 794 and 796 are in the first state (i.e., the closed state). In this case, as shown in FIG. 7F, the first pixel 792 is configured to display only the blue light corresponding to the blue (B) sub-pixel, the second pixel 794 is configured to display only the red light corresponding to the red (R) sub-pixel, and the third pixel 796 is configured to display only the green light corresponding to the green (G) sub-pixel.

Figure 8A:
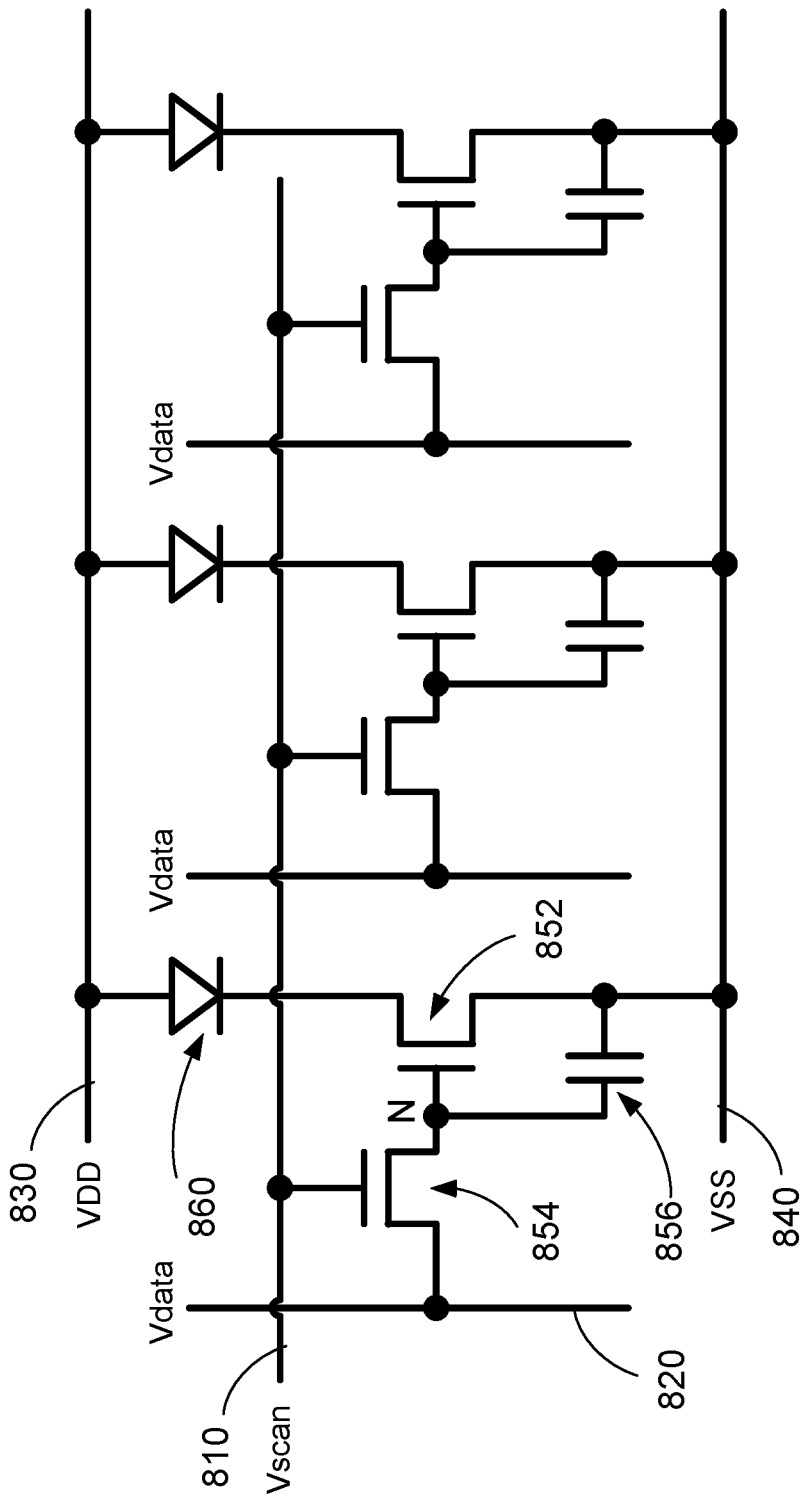
FIG. 8A schematically shows a pixel circuit for the LED display panel as shown in FIG. 7A according to certain embodiments of the present disclosure.

FIGS. 8A to 8E show a pixel circuit as well as the data voltage and the actuating voltage signals for the shutters of the pixel of the LED display panel 700 as shown in FIGS. 7A to 7F. As shown in FIG. 8A, the circuitry 800 includes pixel circuits for three pixels. Specifically, for each pixel, the pixel circuit includes a scan transistor 854, a storage capacitor 856 and a driving transistor 852. Further, each pixel has a micro-LED 860. The micro-LED 860 may be a blue micro-LED 220 as shown in FIG. 2, which has an anode connected to a power supply line 830 to receive a power voltage VDD, and a cathode. The driving transistor 852 has a control end electrically connected to a node N, a first end connected to the cathode of the micro-LED 860, and a second end connected to a power supply line 840 to receive the voltage VSS. The scan transistor 854 has a control end electrically connected to a scan line 810 to receive a scan voltage signal Vscan, a first end electrically connected to a data line 820 to receive a data signal Vdata, and a second end electrically connected to the node N. The storage capacitor 856 has two ends respectively connected to the node N and the power supply line 840.

Figure 8C:
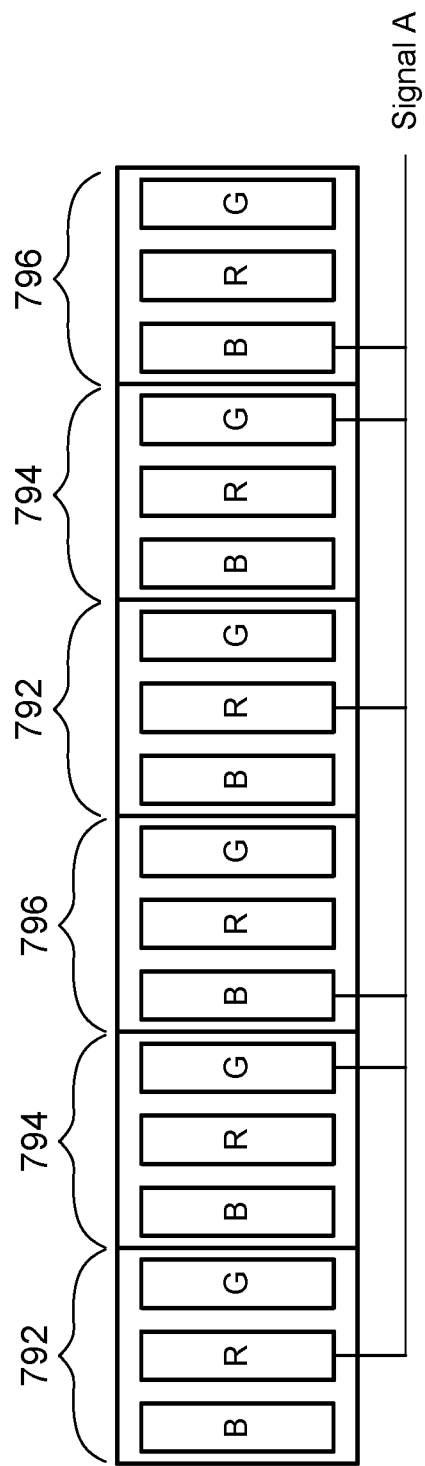
FIG. 8C shows the connections of the sub-pixels to the actuating voltage signal A as shown in FIG. 8B.
Figure 8D:
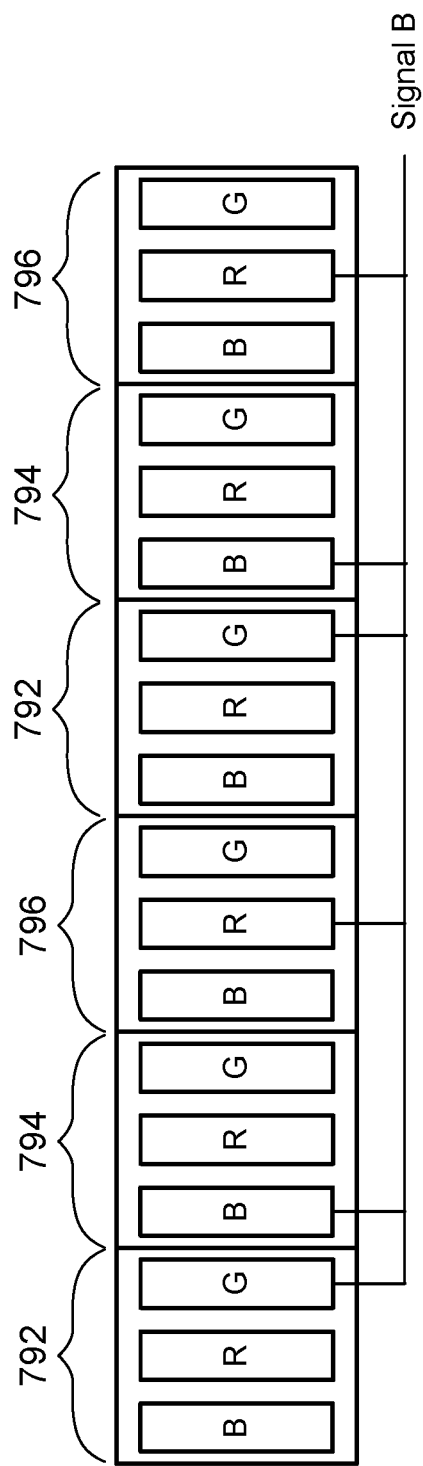
FIG. 8D shows the connections of the sub-pixels to the actuating voltage signal B as shown in FIG. 8B.
Figure 8E:
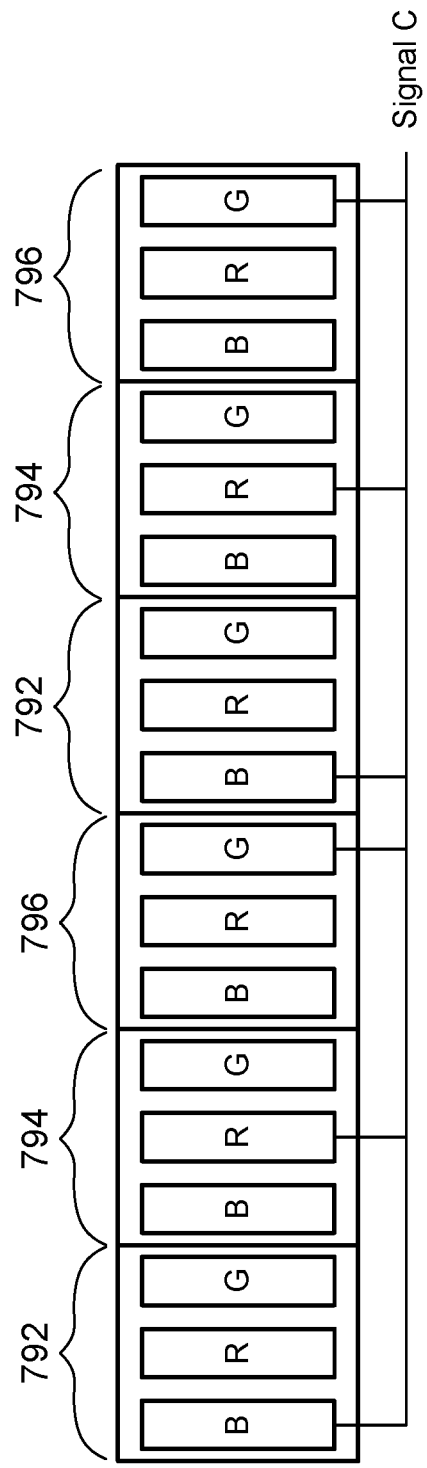
FIG. 8E shows the connections of the sub-pixels to the actuating voltage signal C as shown in FIG. 8B.

As shown in FIG. 8B, each display frame 880 includes three one-third frames. For the each of the three one-third frames, a first actuating voltage signal A, a second actuating voltage signal B and a third actuating voltage signal C are respectively provided to the shutters of the corresponding sub-pixels of the pixels. FIGS. 8C to 8E shows the connections of the sub-pixels to the actuating voltage signals A, B and C. As shown in FIG. 8C, for each pixel group having the three adjacent pixels 792, 794 and 796, the first actuating voltage signal A is provided to the shutters of the red (R) sub-pixel of the first pixel 792, the green (G) sub-pixel of the second pixel 794, and the blue (B) sub-pixel of the third pixel 796. As shown in FIG. 8D, the second actuating voltage signal B is provided to the shutters of the green (G) sub-pixel of the first pixel 792, the blue (B) sub-pixel of the second pixel 794, and the red (R) sub-pixel of the third pixel 796. As shown in FIG. 8E, the third actuating voltage signal C is provided to the shutters of the blue (B) sub-pixel of the first pixel 792, the red (R) sub-pixel of the second pixel 794, and the green (G) sub-pixel of the third pixel 796. In this case, the color sequential feature as shown in FIGS. 7B, 7D and 7F may be implemented.

In the embodiments as described above, the LED display panel utilizes MEMS shutter layers. In certain embodiments, however, other types of shutter technology may be used as the shutter layer of the LED display panel. For example, the shutter layer may be formed by a cholesteric liquid crystal (CLC) layer. CLCs are formed by chiral molecules that arrange themselves into a right-angle helicoidal structure. The periodic structure gives rise to the phenomenon of selective light reflection. In CLCs, the period of the structure is equal to half the pitch p of the helix, and for light propagating along the helical axes, $p0=\lambda 0/n$, where $\lambda 0$ is the wavelength of the maximum reflection or the middle of the Selective Reflection Band (SRB), and n is the average of the refractive indices defined as $n=(ne+no)/2$. The extraordinary and ordinary indices of refraction are denoted by ne and no respectively. The full width at half maximum of the selective reflection band equals to $\Delta\lambda, =p0\Delta n$, where $\Delta n=ne-no$ is the birefringence of a nematic layer perpendicular to the helix axis. In application, when the CLC layer is applied in a LED display panel as the shutter layer, for each of the sub-pixels in a pixel, the CLC layer may switch between a reflective state as the first state (i.e., the closed state) and a transparent state as the second state (i.e., the open state).

Figure 9A:
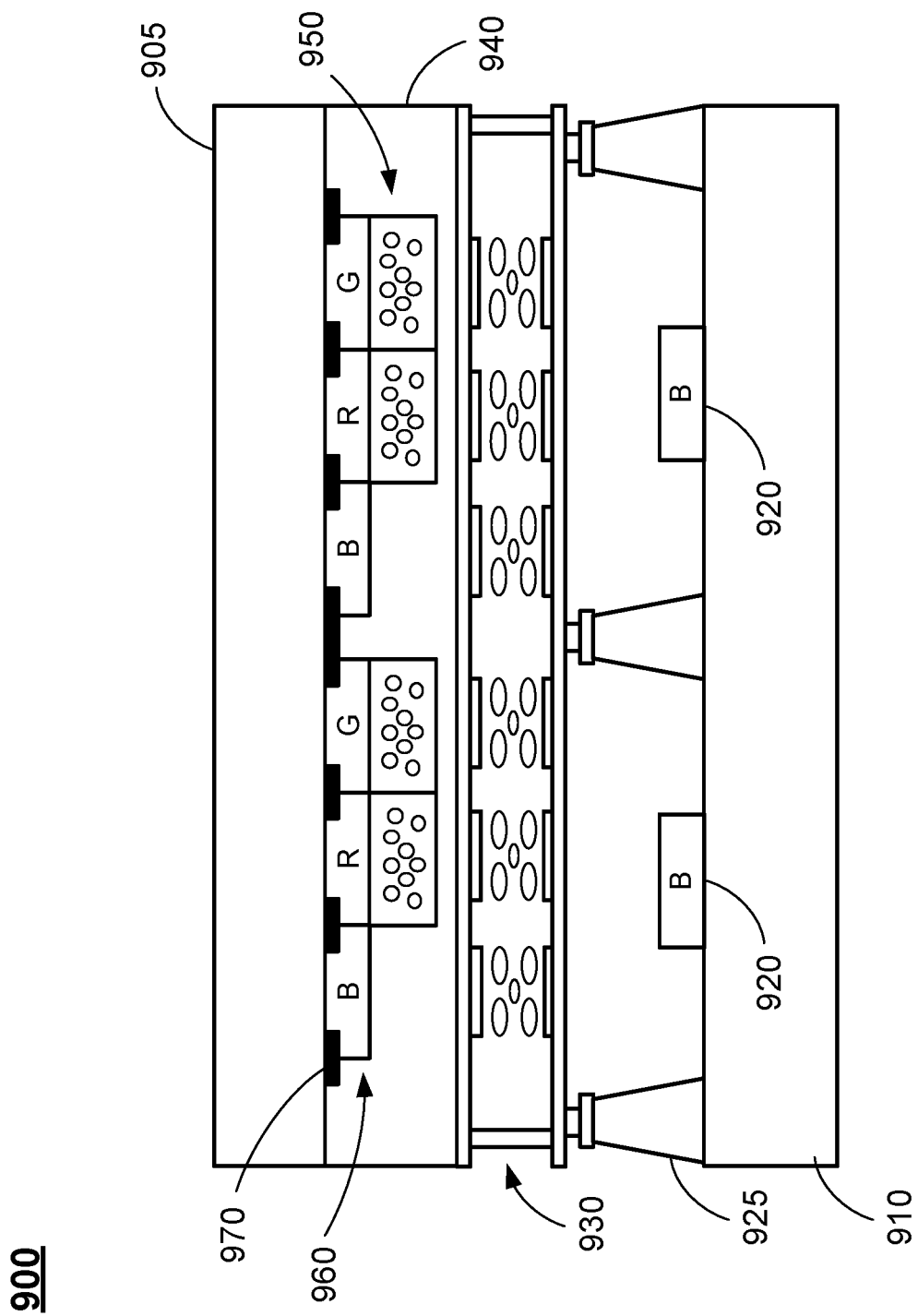
FIG. 9A schematically shows a LED display panel having a cholesteric liquid crystal (CLC) shutter layer according to certain embodiments of the present disclosure.

FIG. 9A schematically shows a LED display panel having a CLC shutter layer according to certain embodiments of the present disclosure. Specifically, FIG. 9A shows two pixels in the LED display panel 900, where each pixel includes three sub-pixels in a red (R) color (i.e., a first color), a green (G) color (i.e., a second color) and a blue (B) color (i.e., a third color). As shown in FIG. 9A, the LED display panel 900 includes two substrates 905 and 910 opposite to each other. For each pixel, a blue micro-LED 920 is provided on the substrate 910. On the substrate 905, a black matrix layer 970, a color filter layer 960 and a color change layer 950 are provided. A passivation layer 940, which functions as an overcoat layer, is provided to cover the black matrix layer 970, the color filter layer 960 and the color change layer 950. The black matrix layer 970, the color filter layer 960, the color change layer 950 and the passivation layer 940 are similar to the corresponding features as shown in FIG. 2, including the black matrix layer 270, the color filter layer 260, the color change layer 250 and the passivation layer 240, and details of these features are not further elaborated herein.

Figure 9B:
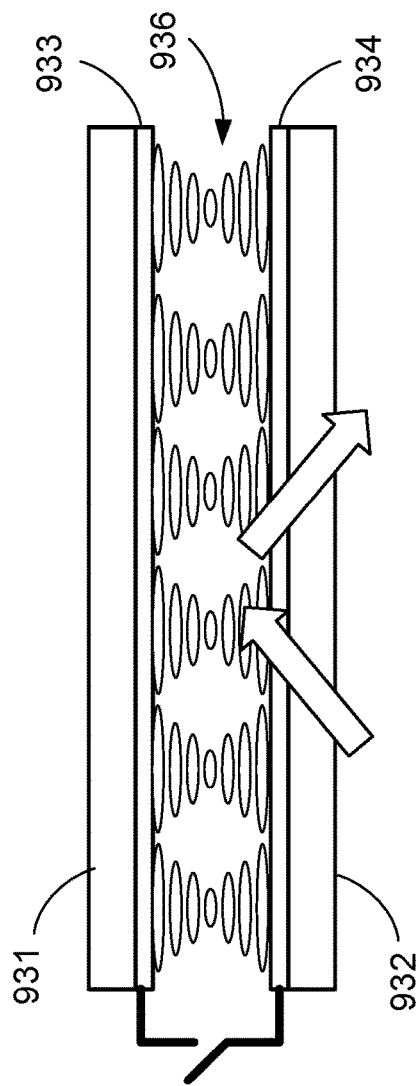
FIG. 9B schematically shows the CLC shutter layer in FIG. 9A in a closed state.
Figure 9C:
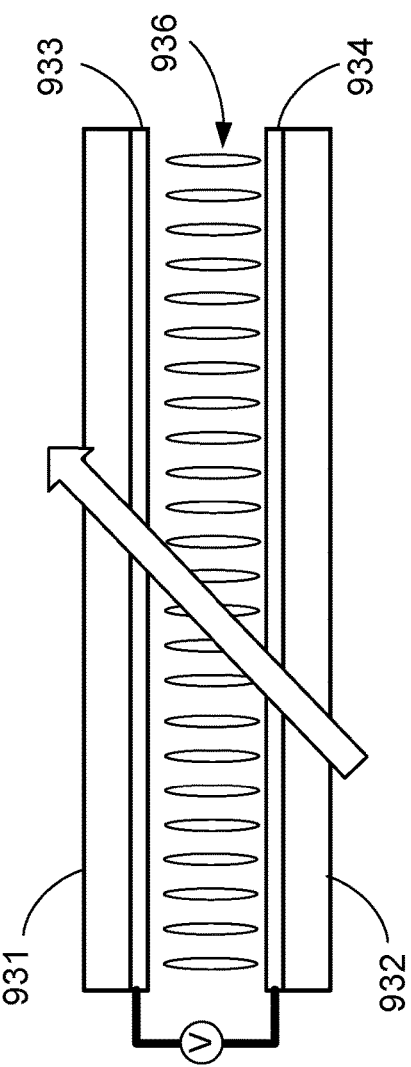
FIG. 9C schematically shows the CLC shutter layer in FIG. 9A in an open state.

The only difference between the LED display panel 900 as shown in FIG. 9A and the LED display panel 200 as shown in FIG. 2 exists in the shutter layer. Specifically, in the LED display panel 900 as shown in FIG. 9A, a CLC shutter layer 930 is formed on the passivation layer 940 facing the blue micro-LEDs 920. Specifically, the CLC shutter layer 930 includes CLC sub-pixels correspondingly aligned to the RGB sub-pixels. Each of the CLC sub-pixels is independently controlled to be switchable between a reflective state as the first state (i.e., the closed state, as shown in FIG. 9B) and a transparent state as the second state (i.e., the open state, as shown in FIG. 9C). Specifically, the CLC shutter layer 930 as shown in FIG. 9A does not show the actual alignment of the CLCs. FIGS. 9B and 9C show a detailed CLC shutter layer 930 according to certain embodiments of the present disclosure, which has two substrates 931 and 932 opposite to each other, two electrodes 933 and 934 provided on the two substrates 931 and 932, and the CLCs 936 disposed between the two electrodes 933 and 934 to form the CLC sub-pixels. As shown in FIG. 9B, when the two electrodes 933 and 934 corresponding to the CLC sub-pixels are not provided with a voltage difference, all of the CLC sub-pixels in the CLC shutter layer 230 are in the reflective state as the first state (i.e., the closed state), such that the blue light emitted by the corresponding blue micro-LED 920 is reflected or blocked by each respective CLC sub-pixel in the reflective state from reaching the corresponding color change structure and/or the corresponding color filter structure. When the two electrodes 933 and 934 corresponding to one of the CLC sub-pixels are provided with a voltage difference, the corresponding one of the CLC sub-pixels is controlled to switch to the transparent state as the second state (i.e., the open state), as shown in FIG. 9C, and the blue light emitted by the corresponding blue micro-LED 920 is allowed to pass through the CLC sub-pixel in the transparent state to reach the corresponding color change structure and/or the corresponding color filter structure.

As discussed above, the only difference between the LED display panel 900 as shown in FIG. 9A and the LED display panel 200 as shown in FIG. 2 exists in the shutter layer. Thus, all features as discussed in the aforementioned embodiments using the MEMS shutter layer may apply to the CLC shutter layer.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light emitting diode (LED) display panel, comprising:
   a LED array formed by a plurality of LEDs, and defining a plurality of pixels, wherein each of the pixels has a corresponding one of the LEDs and a plurality of sub-pixels, and the sub-pixels of each of the pixels comprise a first color sub-pixel, a second color sub-pixel and a third color sub-pixel;
   a color change layer, comprising a plurality of color change structures corresponding to the sub-pixels; and
   a shutter layer disposed between the LED array and the color change layer, defining a plurality of shutter structures correspondingly aligned to the sub-pixels and the color change structures, wherein each of the shutter structures is independently controlled to be switchable between a first state and a second state,
   wherein for a respective shutter structure corresponding to each of the sub-pixels, when the respective shutter structure is in the first state, light emitted by the corresponding one of the LEDs is reflected or blocked by the respective shutter structure in the first state from reaching a corresponding one of the color change structures, and when the respective shutter structure is in the second state, the light emitted by the corresponding one of the LEDs is allowed to pass through the respective shutter structure in the second state to reach the corresponding one of the color change structures; and wherein for each of the pixels, only the shutter structure corresponding to one of the first color, second color and third color sub-pixels is in the second state, and the shutter structures corresponding to the other two of the first color, second color and third color sub-pixels are in the first state.

2. The LED display panel of claim 1, wherein for each of the pixels, in a first one-third frame, the shutter structure corresponding to the first color sub-pixel is in the second state, and the shutter structure corresponding to the second color sub-pixel and the shutter structure corresponding to the third color sub-pixel are in the first state;

in a second one-third frame, the shutter structure corresponding to the second color sub-pixel is in the second state, and the shutter structure corresponding to the third color sub-pixel and the shutter structure corresponding to the first color sub-pixel are in the first state; and in a third one-third frame, the shutter structure corresponding to the third color sub-pixel is in the second state, and the shutter structure corresponding to the first color sub-pixel and the shutter structure corresponding to the second color sub-pixel are in the first state.

3. The LED display panel of claim 1, wherein each of the shutter structures is a micro-electromechanical system (MEMS) shutter structure comprising:

a shielding layer having a plurality of openings aligned to the corresponding one of the sub-pixels to expose a corresponding one of the color change structures; and a micro-shutter corresponding to the openings, wherein the micro-shutter is movable between a first position and a second position relative to the shielding layer;

wherein when the respective shutter structure is in the first state, the micro-shutter of the respective shutter structure moves to the first position to block the openings; and wherein when the respective shutter structure is in the second state, the micro-shutter of the respective shutter structure moves to the second position to allow the light emitted by the corresponding one of the LEDs to pass the openings to reach the corresponding one of the color change structures.

4. The LED display panel of claim 3, wherein the micro-shutter of each of the shutter structures comprises:

a shutter movable between the first position and the second position;

at least one electrostatic actuator configured to drive the shutter to move between the first position and the second position; and a spring structure supporting the shutter to move between the first position and the second position.

5. The LED display panel of claim 4, wherein:

when the at least one electrostatic actuator is provided with an actuating voltage, the at least one electrostatic actuator drives the shutter to move from the first position to the second position, and the spring structure is deformed to generate an elastic force against the shutter; and when the at least one electrostatic actuator is not provided with the actuating voltage, the elastic force generated by the spring structure drives the shutter to move from the second position back to the first position.

6. The LED display panel of claim 4, wherein a thickness of the shutter is between 0.1 um and 20 um, a width of each of the openings is between 5 um and 50 um, and a distance between the first position and the second position is between 5 um and 50 um.

7. The LED display panel of claim 1, wherein the shutter layer is formed by a cholesteric liquid crystal (CLC) layer, and for each of the sub-pixels, the CLC layer is configured to switch between a reflective state as the first state and a transparent state as the second state.

8. The LED display panel of claim 1, wherein the pixels comprises a plurality of pixel groups, each of the pixel groups comprises a first pixel, a second pixel and a third pixel, and for each of the pixel groups, in a first one-third frame, the shutter structure corresponding to the first color sub-pixel of the first pixel is in the second state, the shutter structure corresponding to the second color sub-pixel of the second pixel is in the second state, the shutter structure corresponding to the third color sub-pixel of the third pixel is in the second state, and the shutter structures corresponding to other sub-pixels of the first, second and third pixels are in the first state;

in a second one-third frame, the shutter structure corresponding to the second color sub-pixel of the first pixel is in the second state, the shutter structure corresponding to the third color sub-pixel of the second pixel is in the second state, the shutter structure corresponding to the first color sub-pixel of the third pixel is in the second state, and the shutter structures corresponding to other sub-pixels of the first, second and third pixels are in the first state; and in a third one-third frame, the shutter structure corresponding to the third color sub-pixel of the first pixel is in the second state, the shutter structure corresponding to the first color sub-pixel of the second pixel is in the second state, the shutter structure corresponding to the second color sub-pixel of the third pixel is in the second state, and the shutter structures corresponding to other sub-pixels of the first, second and third pixels are in the first state.

9. The LED display panel of claim 1, wherein each of the LEDs is a blue LED, each of the color change structures corresponding to the first color sub-pixel comprises a first color converter configured to convert blue light emitted by the blue LED to a first color light, and each of the color change structures corresponding to the second color sub-pixel comprises a second color converter configured to convert blue light emitted by the blue LED to a second color light.

10. The LED display panel of claim 9, wherein each of the first color converter and the second color converter is a quantum material structure or a phosphor structure.

11. The LED display panel of claim 9, wherein each of the color change structures further comprises a color filter.

12. A display panel, comprising:

a light-emitting layer formed on a substrate, and defining a plurality of pixels, wherein each of the pixels has a plurality of sub-pixels, and the sub-pixels of each of the pixels comprise a first color sub-pixel, a second color sub-pixel and a third color sub-pixel;

wherein the pixels comprises a plurality of pixel groups, each of the pixel groups comprises a first pixel, a second pixel and a third pixel, and for each of the pixel groups,
- in a first one-third frame, light emitted by the corresponding one of the first pixel is allowed to pass through the first color sub-pixel of the first pixel and is reflective or blocked from reaching the second and third color sub-pixels of the first pixel, light emitted by the corresponding one of the second pixel is allowed to pass through the second color sub-pixel of the second pixel and is reflective or blocked from reaching the first and third color sub-pixels of the second pixel, and light emitted by the corresponding one of the third pixel is allowed to pass through the third color sub-pixel of the third pixel and is reflective or blocked from reaching the first and second color sub-pixels of the third pixel;
- in a second one-third frame, the light emitted by the corresponding one of the first pixel is allowed to pass through the second color sub-pixel of the first pixel and is reflective or blocked from reaching the first and third color sub-pixels of the first pixel, the light emitted by the corresponding one of the second pixel is allowed to pass through the third color sub-pixel of the second pixel and is reflective or blocked from reaching the first and second color sub-pixels of the second pixel, and the light emitted by the corresponding one of the third pixel is allowed to pass through the first color sub-pixel of the third pixel and is reflective or blocked from reaching the second and third color sub-pixels of the third pixel; and
- in a third one-third frame, the light emitted by the corresponding one of the first pixel is allowed to pass through the third color sub-pixel of the first pixel and is reflective or blocked from reaching the first and second color sub-pixels of the first pixel, the light emitted by the corresponding one of the second pixel is allowed to pass through the first color sub-pixel of the second pixel and is reflective or blocked from reaching the second and third color sub-pixels of the second pixel, and the light emitted by the corresponding one of the third pixel is allowed to pass through the second color sub-pixel of the third pixel and is reflective or blocked from reaching the first and third color sub-pixels of the third pixel.

13. The display panel of claim 12, further comprising:
a color change layer, comprising a plurality of color change structures corresponding to the sub-pixels; and
a shutter layer disposed between the light emitting layer and the color change layer, defining a plurality of shutter structures correspondingly aligned to the sub-pixels and the color change structures, wherein each of the shutter structures is independently controlled to be switchable between a first state and a second state,
wherein the light emitting layer is a light emitting diode (LED) array formed by a plurality of LEDs, and each of the pixels has a corresponding one of the LEDs;
wherein for a respective shutter structure corresponding to each of the sub-pixels, when the respective shutter structure is in the first state, light emitted by the corresponding one of the LEDs is reflected or blocked by the respective shutter structure in the first state from reaching a corresponding one of the color change structures, and when the respective shutter structure is in the second state, the light emitted by the corresponding one of the LEDs is allowed to pass through the respective shutter structure in the second state to reach the corresponding one of the color change structures; and
wherein for each of the pixel groups,
- in the first one-third frame, the shutter structure corresponding to the first color sub-pixel of the first pixel is in the second state, the shutter structure corresponding to the second color sub-pixel of the second pixel is in the second state, the shutter structure corresponding to the third color sub-pixel of the third pixel is in the second state, and the shutter structures corresponding to other sub-pixels of the first, second and third pixels are in the first state;
- in the second one-third frame, the shutter structure corresponding to the second color sub-pixel of the first pixel is in the second state, the shutter structure corresponding to the third color sub-pixel of the second pixel is in the second state, the shutter structure corresponding to the first color sub-pixel of the third pixel is in the second state, and the shutter structures corresponding to other sub-pixels of the first, second and third pixels are in the first state; and
- in the third one-third frame, the shutter structure corresponding to the third color sub-pixel of the first pixel is in the second state, the shutter structure corresponding to the first color sub-pixel of the second pixel is in the second state, the shutter structure corresponding to the second color sub-pixel of the third pixel is in the second state, and the shutter structures corresponding to other sub-pixels of the first, second and third pixels are in the first state.

14. The display panel of claim 13, wherein each of the shutter structures is a micro-electromechanical system (MEMS) shutter structure comprising:
a shielding layer having a plurality of openings aligned to the corresponding one of the sub-pixels to expose a corresponding one of the color change structures; and
a micro-shutter corresponding to the openings, wherein the micro-shutter is movable between a first position and a second position relative to the shielding layer;
wherein when the respective shutter structure is in the first state, the micro-shutter of the respective shutter structure moves to the first position to block the openings; and
wherein when the respective shutter structure is in the second state, the micro-shutter of the respective shutter structure moves to the second position to allow the light emitted by the corresponding one of the LEDs to pass the openings to reach the corresponding one of the color change structures.

15. The display panel of claim 14, wherein the micro-shutter of each of the shutter structures comprises:
a shutter movable between the first position and the second position;
at least one electrostatic actuator configured to drive the shutter to move between the first position and the second position; and
a spring structure supporting the shutter to move between the first position and the second position.

16. The display panel of claim 15, wherein:
when the at least one electrostatic actuator is provided with an actuating voltage, the at least one electrostatic actuator drives the shutter to move from the first position to the second position, and the spring structure is deformed to generate an elastic force against the shutter; and when the at least one electrostatic actuator is not provided with the actuating voltage, the elastic force generated by the spring structure drives the shutter to move from the second position back to the first position.

17. The display panel of claim 13, wherein the shutter layer is formed by a cholesteric liquid crystal (CLC) layer, and for each of the sub-pixels, the CLC layer is configured to switch between a reflective state as the first state and a transparent state as the second state.

18. The display panel of claim 13, wherein each of the LEDs is a blue LED, each of the color change structures corresponding to the first color sub-pixel comprises a first color converter configured to convert blue light emitted by the blue LED to a first color light, and each of the color change structures corresponding to the second color sub-pixel comprises a second color converter configured to convert blue light emitted by the blue LED to a second color light.

19. The display panel of claim 18, wherein each of the first color converter and the second color converter is a quantum material structure or a phosphor structure.

20. The display panel of claim 18, wherein each of the color change structures further comprises a color filter.

* * * * *